(12) United States Patent
Hong et al.

(10) Patent No.: US 12,219,828 B2
(45) Date of Patent: Feb. 4, 2025

(54) DISPLAY PANEL AND ELECTRONIC DEVICE

(71) Applicant: Samsung Display Co., Ltd., Yongin-Si (KR)

(72) Inventors: Jongbeom Hong, Yongin-si (KR); Yongsub Shim, Yongin-si (KR); Jungmin Choi, Yongin-si (KR); Youngjun Yoo, Yongin-si (KR); Younho Han, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 418 days.

(21) Appl. No.: 17/831,575

(22) Filed: Jun. 3, 2022

(65) Prior Publication Data

US 2023/0073072 A1 Mar. 9, 2023

(30) Foreign Application Priority Data

Sep. 9, 2021 (KR) ........................ 10-2021-0120544

(51) Int. Cl.
 | | |
 |---|---|
 | H10K 59/126 | (2023.01) |
 | H10K 59/38 | (2023.01) |
 | H10K 77/10 | (2023.01) |
 | H10K 102/00 | (2023.01) |

(52) U.S. Cl.
CPC .......... *H10K 59/126* (2023.02); *H10K 59/38* (2023.02); *H10K 77/111* (2023.02); *H10K 2102/311* (2023.02)

(58) Field of Classification Search
CPC .... H10K 59/126; H10K 59/38; H10K 77/111; H10K 2102/311; H10K 59/352; H10K 59/353; H10K 59/40; H10K 59/65; H10K 59/121
See application file for complete search history.

(56) References Cited

U.S. PATENT DOCUMENTS

| | | | |
|---|---|---|---|
| 10,733,931 B2 | 8/2020 | Jung et al. | |
| 11,189,672 B2 | 11/2021 | Wang et al. | |
| 2023/0337496 A1* | 10/2023 | Liu | H10K 77/10 |

FOREIGN PATENT DOCUMENTS

| | | |
|---|---|---|
| CN | 109300957 B | 2/2019 |
| CN | 111276055 A | 6/2020 |
| CN | 111653201 A | 9/2020 |
| KR | 10-2017-0113066 | 4/1998 |
| KR | 10-2017-0081010 A | 7/2017 |

* cited by examiner

*Primary Examiner* — J. E. Schoenholtz
(74) *Attorney, Agent, or Firm* — Innovation Counsel LLP

(57) ABSTRACT

Provided are a display panel and an electronic device. On a plane, a distance between an edge of a blocking metal layer and a bending point of an electrode may be greater than a set distance.

20 Claims, 22 Drawing Sheets

DISPLAY PANEL AND ELECTRONIC DEVICE

CROSS-REFERENCE TO RELATED APPLICATION

This application is based on and claims priority under 35 U.S.C. § 119 to Korean Patent Application No. 10-2021-0120544, filed on Sep. 9, 2021, in the Korean Intellectual Property Office, the disclosure of which is incorporated by reference herein in its entirety.

BACKGROUND

1. Field

Embodiments relate to an apparatus, and more particularly, to a display panel and an electronic device including the same.

2. Description of the Related Art

Mobile electronic devices are widely used. As mobile electronic devices, tablet PCs have been widely used in recent years in addition to small electronic devices such as mobile phones.

Such mobile electronic devices include a display apparatus to provide a user with visual information such as images or video to support various functions. Recently, as other components for driving display apparatuses have been miniaturized, the proportion occupied by display apparatuses in electronic devices is gradually increasing, Further, a structure that may be bent to have a certain angle from a flat state has also been developed.

SUMMARY

A component such as a camera or a sensor may be arranged to add various functions. To arrange the component while securing a larger area of a display region, the component may be arranged to overlap the display region. As one method of arranging the component, a display panel may include a transmission region through which wavelengths such as light or sound may be transmitted. In accordance with an embodiment, a display panel having the structure described above and an electronic device including the same is presented.

Additional aspects will be set forth in part in the description which follows and, in part, will be apparent from the description, or may be learned by practice of the presented embodiments of the disclosure.

According to an embodiment, a display panel includes a first display region, a second display region, an upper insulating layer, an electrode, and a blocking metal layer. First light-emitting diodes are located in the first display region. The second display region is at least partially surrounded by the first display region. Display element groups including second light-emitting diodes and a transmission region are located in the second display region. The upper insulating layer defines an emission region of each of the first light-emitting diodes and the second light-emitting diodes and includes a tapered portion adjacent to the transmission region. The electrode is on the upper insulating layer and includes an opening to correspond to the transmission region. The blocking metal layer is under the upper insulating layer. On a plane, a distance between an edge of the blocking metal layer and a point of the electrode bent at a tapered edge of the upper insulating layer is greater than a set distance defined by an Equation 1. Equation 1 may be $Y = H \times \tan \theta$. Here, Y refers to a set distance, H refers to a height from a lower surface of the blocking metal layer to a lower surface of the electrode bent at the tapered edge of the upper insulating layer, and θ refers to one of angles of 45 degrees or less.

In an embodiment, the upper insulating layer may include first openings corresponding to the first light-emitting diodes, second openings corresponding to the second light-emitting diodes, and a third opening between the first light-emitting diodes and the second light-emitting diodes.

In an embodiment, the opening of the electrode may overlap the third opening.

In an embodiment, the display panel further comprises thin-film transistors respectively electrically connected to the first light-emitting diodes and the second light-emitting diodes. Each of the thin-film transistors may include a semiconductor layer, a gate electrode overlapping a portion of the semiconductor layer, one electrode selected from a source electrode and a drain electrode, and an insulating layer between at least two selected from the semiconductor layer, the gate electrode, and the one electrode.

In an embodiment, the insulating layer may include an insulating layer opening overlapping the third opening of the upper insulating layer.

In an embodiment, the display panel may further include an organic insulating layer on the insulating layer, and a portion of the organic insulating layer may be located in the insulating layer opening.

In an embodiment, the display panel may further include an anti-reflective layer on the upper insulating layer and including a light-blocking layer and color filters.

In an embodiment, the upper insulating layer may be opaque.

In an embodiment, the transmission region may be defined by the upper insulating layer, the blocking metal layer, or the upper insulating layer and the blocking metal layer.

According to an embodiment, an electronic device includes a display panel including a first display region, a second display region, an upper insulating layer, an electrode, a blocking metal layer, and a component. First light-emitting diodes are located in the first display region. Second light-emitting diodes and a transmission region are located in the second display region. The component is on a lower surface of the display panel and overlaps the second display region. The upper insulating layer defines an emission region of each of the first light-emitting diodes and the second light-emitting diodes. The upper insulating layer includes a tapered portion adjacent to the transmission region. The electrode is on the upper insulating layer and includes an opening to correspond to the transmission region. The blocking metal layer is under the upper insulating layer. On a plane, a distance between an edge of the blocking metal layer and a point of the electrode bent at a tapered edge of the upper insulating layer is greater than a set distance defined by an Equation 1. Equation 1 may be $Y = H \times \tan \theta$. Here, Y refers to a set distance, H refers to a height from a lower surface of the blocking metal layer to a lower surface of the electrode bent at the tapered edge of the upper insulating layer, and θ refers to one of angles of 45 degrees or less.

In an embodiment, the upper insulating layer may include first openings corresponding to the first light-emitting diodes, second openings corresponding to the second light-emitting diodes, and a third opening between the display element groups.

In an embodiment, the opening of the electrode may overlap the third opening.

In an embodiment, the electronic device further comprises thin-film transistors respectively electrically connected to the first light-emitting diodes and the second light-emitting diodes. Each of the thin-film transistors may include a semiconductor layer, a gate electrode overlapping a portion of the semiconductor layer, one electrode selected from a source electrode and a drain electrode, and an insulating layer between at least two selected from the semiconductor layer, the gate electrode, and the one electrode.

In an embodiment, the insulating layer may include an insulating layer opening overlapping the third opening of the upper insulating layer.

In an embodiment, the electronic device may further include an organic insulating layer on the insulating layer, and a portion of the organic insulating layer may be located in the insulating layer opening.

In an embodiment, the electronic device may further include an anti-reflective layer arranged on the upper insulating layer and including a light-blocking layer and color filters.

In an embodiment, the upper insulating layer may be opaque.

In an embodiment, the transmission region may be defined by the upper insulating layer, the blocking metal layer, or the upper insulating layer and the blocking metal layer.

In an embodiment, the component may include at least one of a sensor and a camera.

Other aspects, features, and advantages will be apparent from the following drawings, claims, and detailed description of the disclosure.

BRIEF DESCRIPTION OF THE DRAWINGS

The above and other aspects and features of certain embodiments of the disclosure will be more apparent from the following description taken in conjunction with the accompanying drawings.

DETAILED DESCRIPTION

Figure 1:
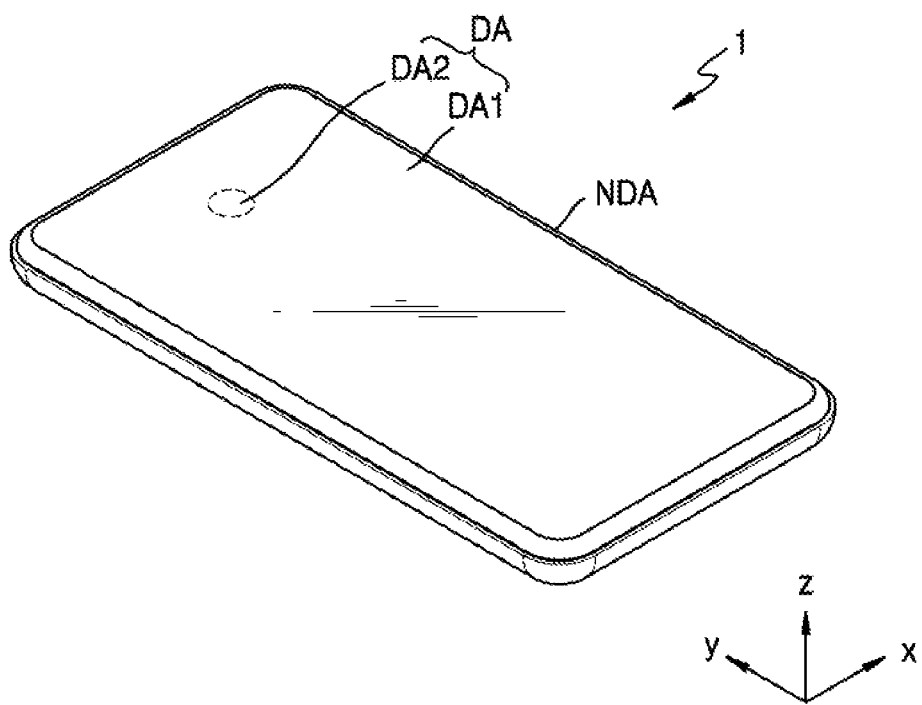
FIG. 1 is a perspective view of an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. An effect and a characteristic of the disclosure, and a method of accomplishing them will be apparent when referring to embodiments described with reference to the drawings. This disclosure may, however, be embodied in many different forms and should not be construed as limited to the embodiments set forth herein.

Hereinafter, embodiments of the disclosure will now be described in detail with reference to the accompanying drawings. When described with reference to the drawings, identical or corresponding components will be given the same reference numerals, and redundant description of these components will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. For example, since sizes and thicknesses of components in the drawings are arbitrarily illustrated for convenience of explanation, the following embodiments are not limited thereto.

In embodiments hereinafter, an x-axis, a y-axis, and a z-axis are three axes of the rectangular coordinate system, but may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or may be performed in an order opposite to the described order.

FIG. 1 is a perspective view of an electronic device 1 according to an embodiment.

The electronic device 1 according to an embodiment is an apparatus configured to display a video or a still image, and may be used as display screens of various products such as televisions, laptops, monitors, billboards, or Internet of Things (IOTs) as well as mobile electronic devices such as mobile phones, smart phones, tablet personal computers (PCs), mobile communication terminals, electronic notebooks, e-books, portable multimedia players (PMPs), navigators, or ultra-mobile PCs (UMPCs). Also, the electronic device 1 according to an embodiment may be used in wearable devices such as smart watches, watch phones, glass-type displays, or head mounted displays (HMDs). Also, the electronic device 1 according to an embodiment may be used as a vehicle's dashboard, a center information display (CID) located at a vehicle's center fascia or dashboard, a room mirror display covering for a vehicle's side-view mirror, or a display, which is located at the back of a front seat, as entertainment for a passenger in a back seat of a vehicle. FIG. 1 illustrates that the electronic device 1 is used as a smart phone for convenience of description.

Referring to FIG. 1, the electronic device 1 may include a display region DA and a non-display region NDA outside the display region DA. The electronic device 1 may provide an image through an array of a plurality of pixels that are two-dimensionally arranged in the display region DA.

The non-display region NDA is a region that does not provide an image and may entirely surround the display region DA. A driver for providing display elements arranged in the display region DA with an electrical signal or a power source may be arranged in the non-display region NDA. A pad, to which electronic elements, printed circuit boards, or the like may be electrically connected, may be arranged in the non-display region NDA.

The display region DA may include a first display region DA1 and a second display region DA2. The second display region DA2 is a region in which a component for adding various functions to the electronic device 1 is arranged, and the second display region DA2 may correspond to a component region.

Figure 2A:
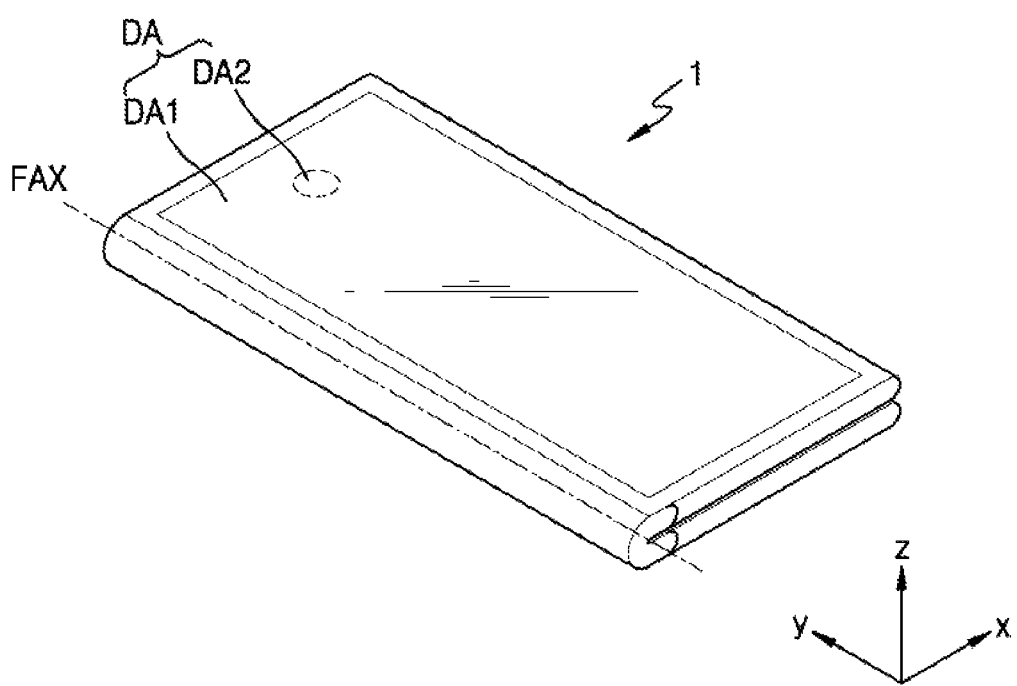
FIG. 2A is a perspective view of a foldable electronic device in a folded state, according to an embodiment.
Figure 2B:
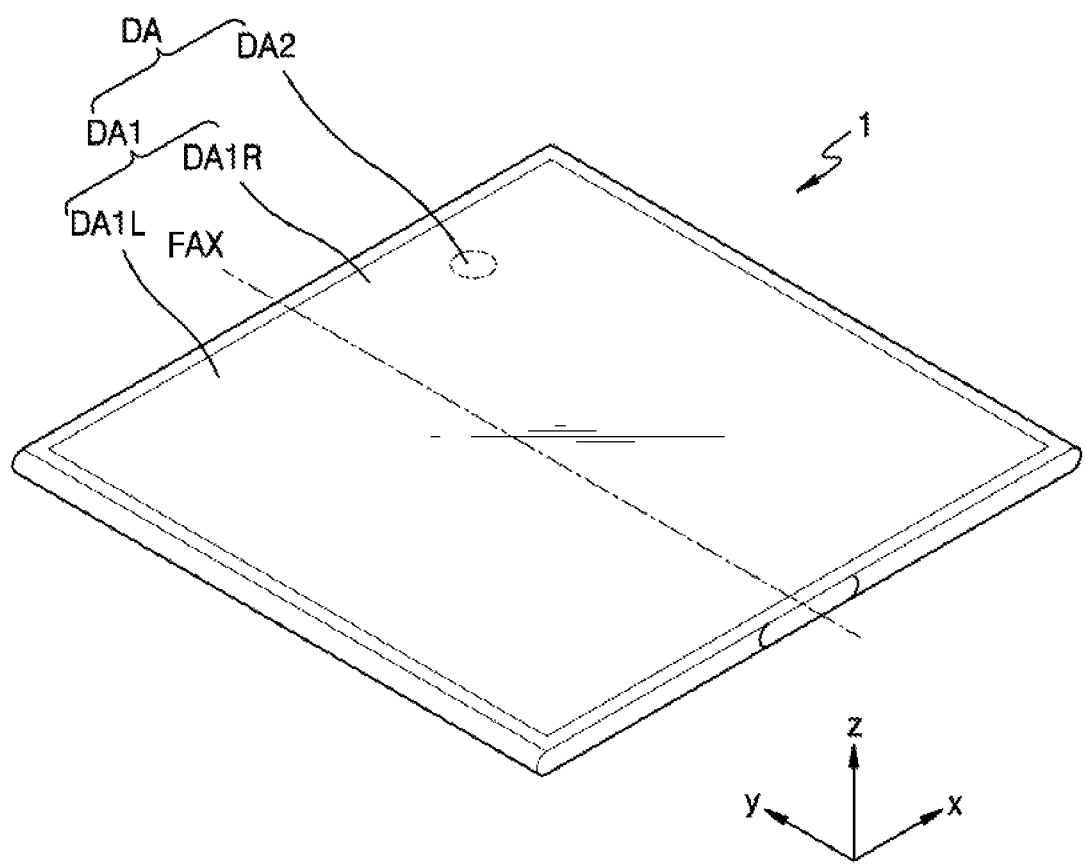
FIG. 2B illustrates a foldable electronic device in an unfolded state, according to an embodiment.

FIGS. 2A and 2B are perspective views of a foldable electronic device 1 according to an embodiment, wherein FIG. 2A shows the foldable electronic device 1 in a folded state, and FIG. 2B shows a foldable electronic device 1 in an unfolded state.

The electronic device 1 of FIG. 1 according to an embodiment may be the foldable electronic device of FIGS. 2A and 2B. Referring now to FIGS. 2A and 2B, the foldable electronic device 1, sometimes also referred to as the electronic device 1, may be folded with respect to a folding axis FAX. The display region DA may be located on an outer side and/or inner side of the electronic device 1. In an embodiment, FIGS. 2A and 2B shows that the display region DA is located on each of the outer side and inner side of the electronic device 1.

Referring to FIG. 2A, the display region DA may be arranged on the outer side of the electronic device 1. An outer surface of the folded electronic device 1 may include the display region DA. The display region DA may include the first display region DA1 occupying most of the display region DA, and the second display region DA2 having a relatively smaller area than that of the first display region DA1.

Referring to FIG. 2B, the display region DA may be arranged on the inner side of the electronic device 1. An inner surface of the unfolded electronic device 1 may include the display region DA. The display region DA may include the first display region DA1 occupying most of the display region DA, and the second display region DA2 occupying a relatively smaller area of the display region DA than that of the first display region DA1.

FIG. 2B illustrates that the first display region DA1 includes a left display region DA1L and a right display region DA1R respectively arranged at both sides with respect to the folding axis FAX. The second display region DA2 is located inside the right display region DA1R. However, in an embodiment, the second display region DA2 may be arranged inside the left display region DA1L.

Figure 3:
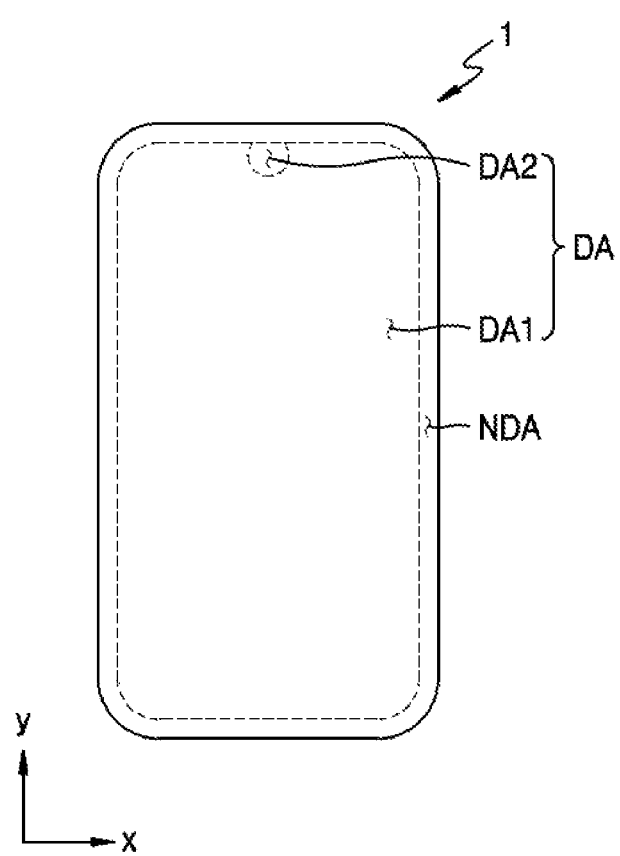
FIG. 3 is a schematic plan view of an electronic device according to an embodiment.

FIGS. 1, 2A, and 2B illustrate that the second display region DA2 is entirely surrounded by the first display region DA1. FIG. 3 is a schematic plan view of an electronic device 1 according to an embodiment. As shown in FIG. 3, the second display region DA2 may be partially surrounded by the first display region DA1.

Figure 4A:
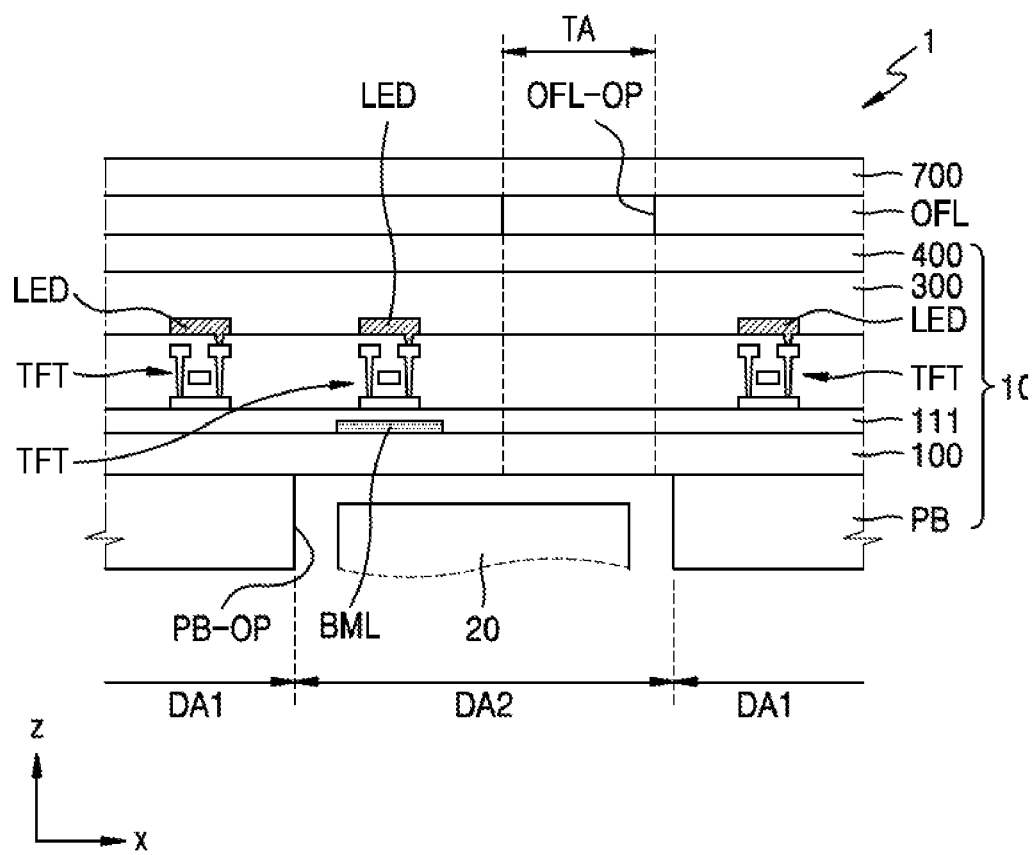
FIGS. 4A and 4B are each a cross-sectional view of a portion of an electronic device, according to an embodiment.

FIG. 4A is a cross-sectional view of a portion of an electronic device 1 according to an embodiment.

Referring to FIG. 4A, the electronic device 1 may include a display panel 10 and a component 20 arranged to overlap the display panel 10 and arranged on a lower surface of the display panel 10. The component 20 may be located in the second display region DA2.

The display panel 10 may include a substrate 100, a thin-film transistor TFT arranged above the substrate 100, a display element, for example, a light-emitting diode (LED), electrically connected to the thin-film transistor TFT, an encapsulation layer 300 covering the display element, an input sensing layer 400, an anti-reflective layer OFL, sometimes called an optical functional layer OFL, and a window 700.

The substrate 100 may include glass or a polymer resin. The substrate 100 including polymer resin may have flexible, foldable, rollable, or bendable characteristics. The substrate 100 may be of a multilayer structure including a layer including the polymer resin and an inorganic layer.

A lower protective film PB may be arranged on a lower surface of the substrate 100. The lower protective film PB may be attached to the lower surface of the substrate 100. An adhesive layer may be located between the lower protective film PB and the substrate 100. Alternatively, the lower protective film PB may be directly formed on a back surface of the substrate 100, and in this case, an adhesive layer may not be located between the lower protective film PB and the substrate 100.

The lower protective film PB may serve to support and protect the substrate 100. The lower protective film PB may include an opening PB-OP corresponding to the second display region DA2. The lower protective film PB may include an organic insulation material such as polyethyeleneterephthalate (PET) or polyimide (PI).

The thin-film transistor TFT and a light-emitting diode LED as the display element electrically connected to the thin-film transistor TFT may be arranged above the lower surface of the substrate 100. The light-emitting diode LED may be an organic light-emitting diode including an organic material. The organic light-emitting diode may emit red, green, or blue light.

The light-emitting diode LED may be an inorganic light-emitting diode including an inorganic material. The inorganic light-emitting diode may include a PN junction diode including inorganic semiconductor-based materials. When voltage is applied to the PN junction diode in a forward direction, holes and electrons are injected, and energy generated by recombination of the holes and electrons is converted into light energy, such that light of a certain color may be emitted. The inorganic light-emitting diode may have a width of several hundred micrometers or several hundred nanometers. In some embodiments, the light-emitting diode LED may include a quantum dot light-emitting diode. An emission layer of the light-emitting diode LED may include an organic material, an inorganic material, a quantum dot, an organic material and a quantum dot, or an inorganic material and a quantum dot.

Figure 4B:
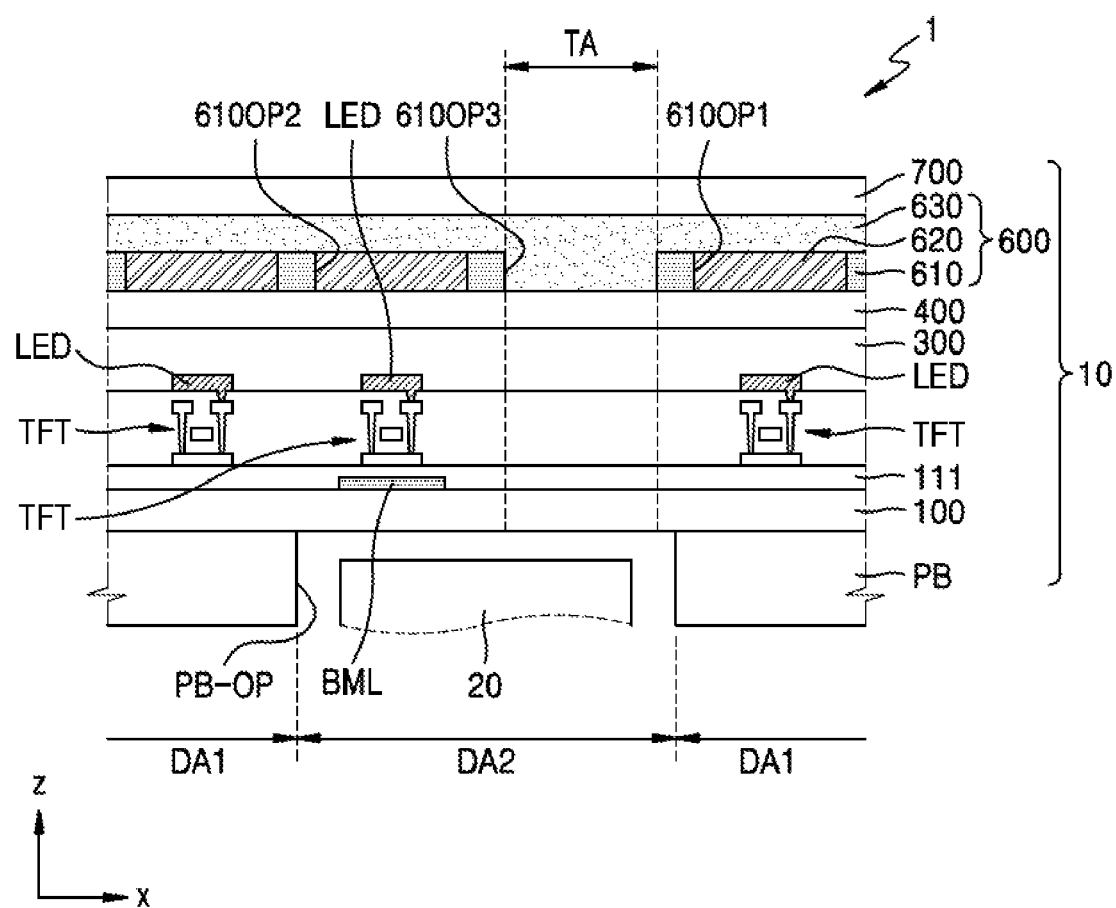

The light-emitting diode LED may be electrically connected to the thin-film transistor TFT arranged under the light-emitting diode LED. In this regard, FIGS. 4A and 4B illustrate that a buffer layer 111 is arranged on the substrate 100 and the thin-film transistor TFT is arranged on the buffer layer 111. The thin-film transistor TFT and the light-emitting diode LED electrically connected to the thin-film transistor TFT may be respectively arranged in the first display region DA1 and the second display region DA2.

A transmission region TA may be located in the second display region DA2. The transmission region TA is a region through which light emitted from the component 20 and/or light directed to the component 20 may be transmitted. In the display panel 10, a transmittance of the transmission region TA may be greater than or equal to about 30%, greater than or equal to about 40%, greater than or equal to about 50%, greater than or equal to about 60%, greater than or equal to about 70%, greater than or equal to about 75%, greater than or equal to about 80%, greater than or equal to about 85%, or greater than or equal to about 90%.

The component 20 may include a sensor such as a proximity sensor, an illuminance sensor, an iris sensor, or a facial recognition sensor, and a camera, e.g., an image sensor. The component 20 may use light. For example, the component 20 may emit and/or receive light in infrared, ultraviolet, and visible bands. The proximity sensor using infrared rays may detect an object arranged adjacent to a lower surface of the electronic device 1. The illuminance sensor may sense brightness of light incident on the lower surface of the electronic device 1. Also, the iris sensor may capture an image of an iris of a person positioned adjacent to the lower surface of the electronic device 1. The camera may receive light on an object arranged adjacent to on the lower surface of the electronic device 1.

To prevent functions of the thin-film transistor TFT arranged in the second display region DA2 from being deteriorated by light passing through the transmission region TA, a blocking metal layer BML may be arranged between the substrate 100 and the buffer layer 111. The blocking metal layer BML may not be located in the first display region DA1. The blocking metal layer BML may be located in the second display region DA2, and may include an opening overlapping the transmission region TA. In this case, the blocking metal layer BML may be arranged under the second display region DA2.

The encapsulation layer 300 may cover the light-emitting diode LED. The encapsulation layer 300 may include at least one inorganic encapsulation layer and at least one organic encapsulation layer. In an embodiment, the encapsulation layer 300 may include a first inorganic encapsulation layer, a second inorganic encapsulation layer, and an organic encapsulation layer between the first and second inorganic encapsulation layers.

The input sensing layer 400 may be formed on the encapsulation layer 300. The input sensing layer 400 may obtain coordinate information according to an external input, for example, a touch event of an object such as a finger or a stylus pen. The input sensing layer 400 may include a touch electrode and trace lines connected to the touch electrode. The input sensing layer 400 may sense an external input by using a mutual capacitance method or a self-capacitance method.

The optical functional layer OFL may be arranged on the input sensing layer 400. The optical functional layer OFL may include an anti-reflective layer. The anti-reflective layer may reduce reflectance of light, e.g., external light, incident from the outside to the display panel 10.

In some embodiments, the optical functional layer OFL may be a polarizing film. The optical functional layer OFL may include an opening OFL-OP corresponding to the transmission region TA. Accordingly, light transmittance of the transmission region TA may be significantly improved. The opening OFL-OP may be filled with a transparent material such as an optically clear resin (OCR).

The window 700 is arranged on the optical functional layer OFL. The window 700 may be coupled to the optical functional layer OFL through an adhesive layer such as an optically transparent adhesive. The window 700 may include a glass material or a plastic material. The glass material may include ultra-thin glass. The plastic material may include polyether sulfone, polyacrylate, polyether imide, polyethylene naphthalate, polyethylene terephthalate, polyphenylene sulfide, polyarylate, polyimide, polycarbonate, or cellulose acetate propionate.

FIG. 4B is a cross-sectional view of a portion of an electronic device 1 according to an embodiment.

Referring to FIG. 4B, the electronic device 1 may include a display panel 10 and a component 20 arranged to overlap the display panel 10 and arranged on a lower surface of the display panel 10. The component 20 may be located in the second display region DA2.

The display panel 10 may include a substrate 100, a thin-film transistor TFT arranged above the substrate 100, a display element, for example, a light-emitting diode LED, electrically connected to the thin-film transistor TFT, an encapsulation layer 300 covering a light-emitting diode LED, an input sensing layer 400, an anti-reflective layer 600, and a window 700. In this case, the substrate 100, the thin-film transistor TFT, the light-emitting diode LED, the encapsulation layer 300, and the input sensing layer 400 are respectively the same as or similar to those described with reference to FIG. 4A.

The anti-reflective layer 600 may reduce reflectance of light, e.g., external light, incident from the outside to the display panel 10. The anti-reflective layer 600 may include a light-blocking layer 610, color filters 620, and an overcoat layer 630. The light-blocking layer 610 may include an opening 610OP1 overlapping the light-emitting diode LED in the first display region DA1 and an opening 610OP2 overlapping the light-emitting diode LED in the second display region DA2. The color filters 620 may be respectively arranged in the openings 610OP1 and 610OP2. The light-blocking layer 610 may include an opening 610OP3 that does not overlap the light-emitting diode LED. The opening 610OP3 is region corresponding to the transmission region TA. A portion of the overcoat layer 630 may be located in the opening 610OP3.

The window 700 is arranged on the anti-reflective layer 600. In this case, the window 700 is the same or similar to that described with reference to FIG. 4A.

Meanwhile, the display panel 10 shown in FIG. 4A and the display panel 10 shown in FIG. 4B are similar to each other, and thus, hereinafter, for convenience of description, the display panel 10 shown in FIG. 4B is mainly described in detail.

Figure 5:
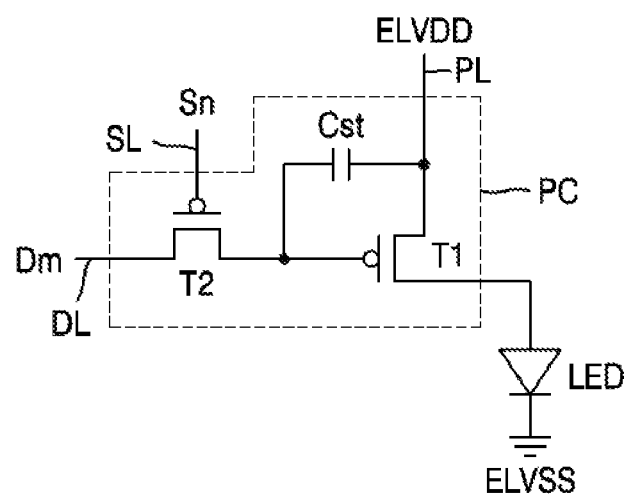
FIG. 5 is a schematic equivalent circuit diagram of a pixel circuit electrically connected to a light-emitting diode of a display panel, according to an embodiment.

FIG. 5 is a schematic equivalent circuit diagram of a pixel circuit PC electrically connected to a light-emitting diode of a display panel, according to an embodiment.

Referring to FIG. 5, the pixel circuit PC may include a first thin-film transistor T1, a second thin-film transistor T2, and a storage capacitor Cst.

The second thin-film transistor T2 is connected to a scan line SL and a data line DL as a switching thin-film transistor, and may transmit, to the first thin-film transistor T1, a data voltage Dm, e.g., a data signal, input from the data line DL based on a switching voltage Sn, e.g., a switching signal, input from the scan line SL. The storage capacitor Cst may be connected to the second thin-film transistor T2 and a driving voltage line PL, and may store a voltage corresponding to a difference between a voltage received from the second thin-film transistor T2 and a first power voltage ELVDD supplied to the driving voltage line PL.

The first thin-film transistor T1 is connected to the driving voltage line PL and the storage capacitor Cst as a driving thin-film transistor, and may control a driving current flowing from the driving voltage line PL to a light-emitting diode LED, e.g., an organic light-emitting diode (OLED), in response to a voltage value stored in the storage capacitor Cst. The light-emitting diode LED may emit light having a certain luminance by the driving current. A counter electrode, e.g., a cathode, of the light-emitting diode LED may receive a second power voltage ELVSS.

FIG. 5 illustrates that the pixel circuit PC includes two thin-film transistors and one storage capacitor. However, the number of thin-film transistors and the number of storage capacitors may be variously changed according to a design of the pixel circuit PC. For example, the pixel circuit PC may include three thin-film transistors, four thin-film transistors, five thin-film transistors, or more than five thin-film transistors.

Figure 6:
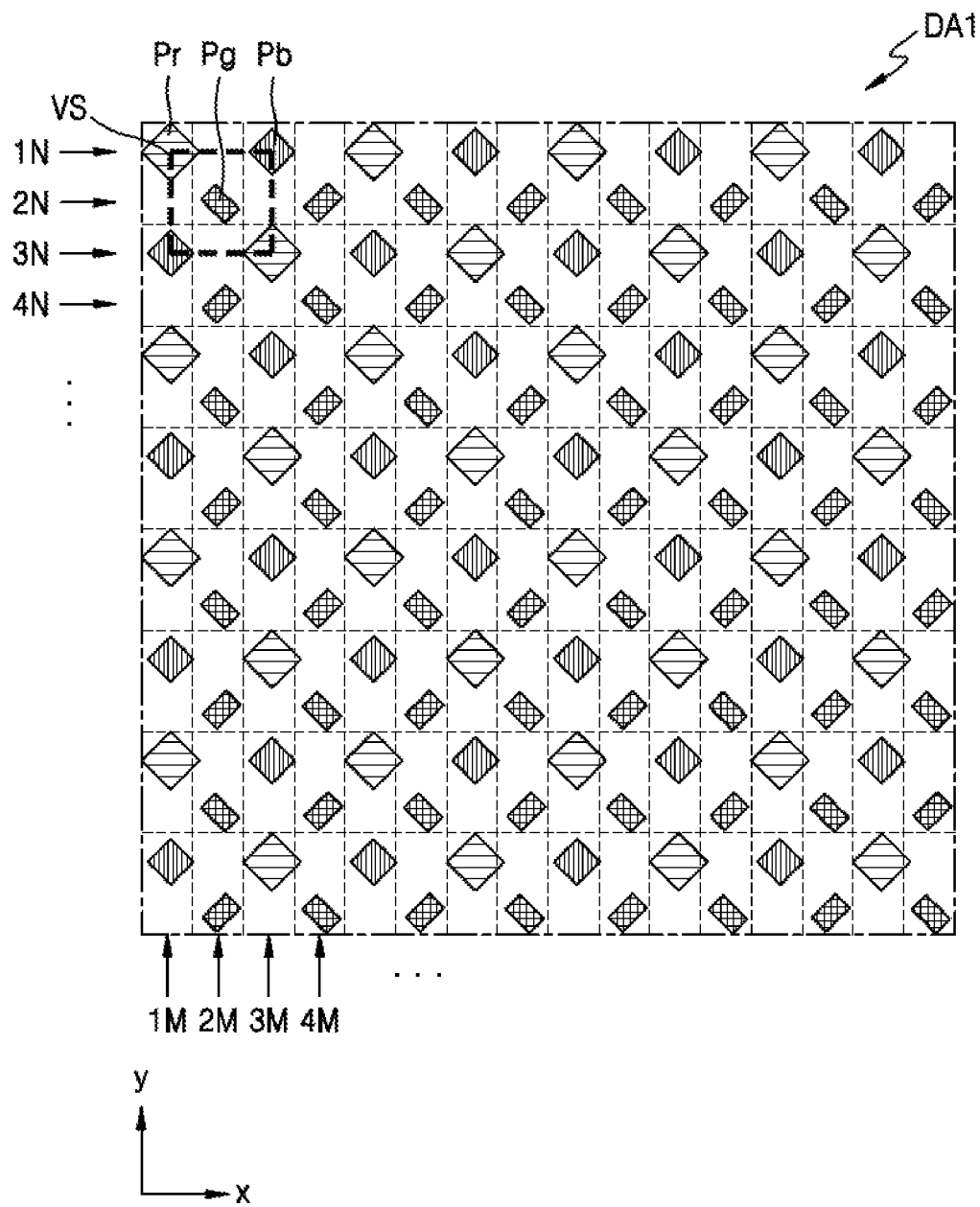
FIG. 6 is a plan view of a portion of a first display region of a display panel, according to an embodiment.

FIG. 6 is a plan view of a portion of a first display region DA1 of a display panel, according to an embodiment.

Referring to FIG. 6, pixels are arranged in the first display region DA1, and the pixels may include first to third pixels emitting light of different colors. Hereinafter, for convenience of description, it is described that the first pixel is a red pixel Pr, the second pixel is a green pixel Pg, and the third pixel is a blue pixel Pb.

The red pixel Pr, the green pixel Pg, and the blue pixel Pb may be arranged in the first display region DA1 according to a certain rule. In some embodiments, the red pixel Pr, the green pixel Pg, and the blue pixel Pb may be arranged in a diamond pentile (PenTile™) type, as shown in FIG. 6.

For example, a plurality of red pixels Pr and a plurality of blue pixels Pb are alternately arranged in a first row 1N. A plurality of green pixels Pg are spaced apart from each other by a certain distance in a neighboring second row 2N. The plurality of blue pixels Pb and the plurality of red pixels Pr are alternately arranged in a neighboring third row 3N. The plurality of green pixels Pg are spaced apart from each other by a certain distance in a neighboring fourth row 4N. This structuring of pixels is repeated up to an Nth row. In this case, sizes, e.g., width, of the blue pixel Pb and the red pixel Pr may be greater than a size, e.g., width, of the green pixel Pg.

The plurality of red pixels Pr arranged in the first row 1N and the plurality of green pixels Pg arranged in the second row 2N are alternately arranged. Thus, the plurality of red pixels Pr and the plurality of blue pixels Pb are alternately arranged in a first column 1M. The plurality of green pixels Pg are spaced apart from each other by a certain distance in a neighboring second column 2M. The plurality of blue pixels Pb and the plurality of red pixels Pr are alternately arranged in a neighboring third column 3M. The plurality of green pixels Pg are spaced apart from each other by a certain distance in a neighboring fourth column 4M. This structuring of pixels is repeated up to a Mth column.

When this pixel structure is differently expressed, it may be expressed that the red pixel Pr is arranged at a first vertex and a third vertex, which face each other among vertices of a virtual quadrangle VS having a center point of the green pixel Pg as a center point of a quadrangle, and the blue pixel Pb is arranged at remaining vertices, that is, a second vertex and a fourth vertex. In this case, the virtual quadrangle VS may be variously modified into a rectangle, a rhombus, a square, and the like.

This pixel structure is referred to as a diamond pentile (PenTile™) type, and by applying a rendering driving that expresses colors by sharing neighboring pixels, high resolution may be implemented with a small number of pixels.

The red pixel Pr, the green pixel Pg, and the blue pixel Pb shown in FIG. 6 may respectively emit red, green, and blue light by using a light-emitting diode arranged in a corresponding pixel. Thus, structuring of pixels may correspond to structuring of light-emitting diodes that are display elements. For example, a position of the red pixel Pr shown in FIG. 6 may indicate a position of a light-emitting diode emitting red light. Likewise, a position of the green pixel Pg may indicate a position of a light-emitting diode emitting green light, and a position of the blue pixel Pb may indicate a position of a light-emitting diode emitting blue light.

Figure 7A:
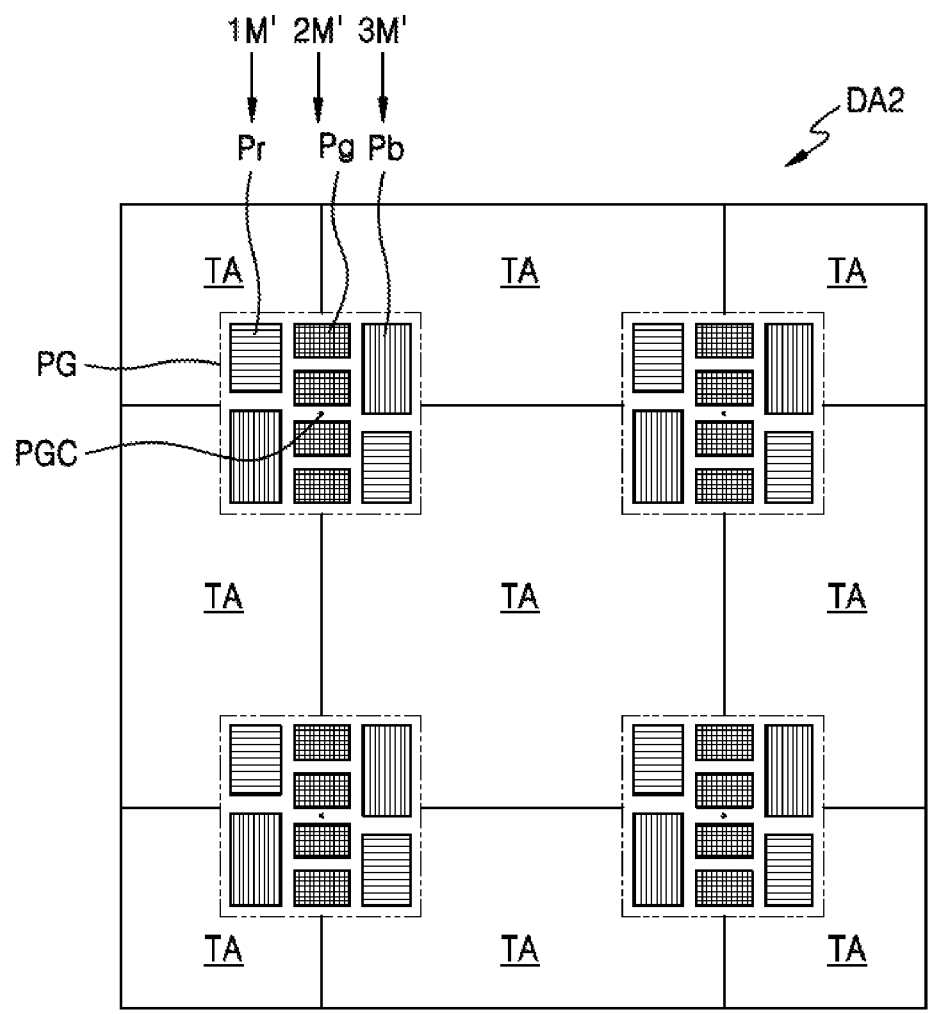
FIGS. 7A and 7B are plan views of a portion of a second display region of a display panel, according to an embodiment.
Figure 7B:
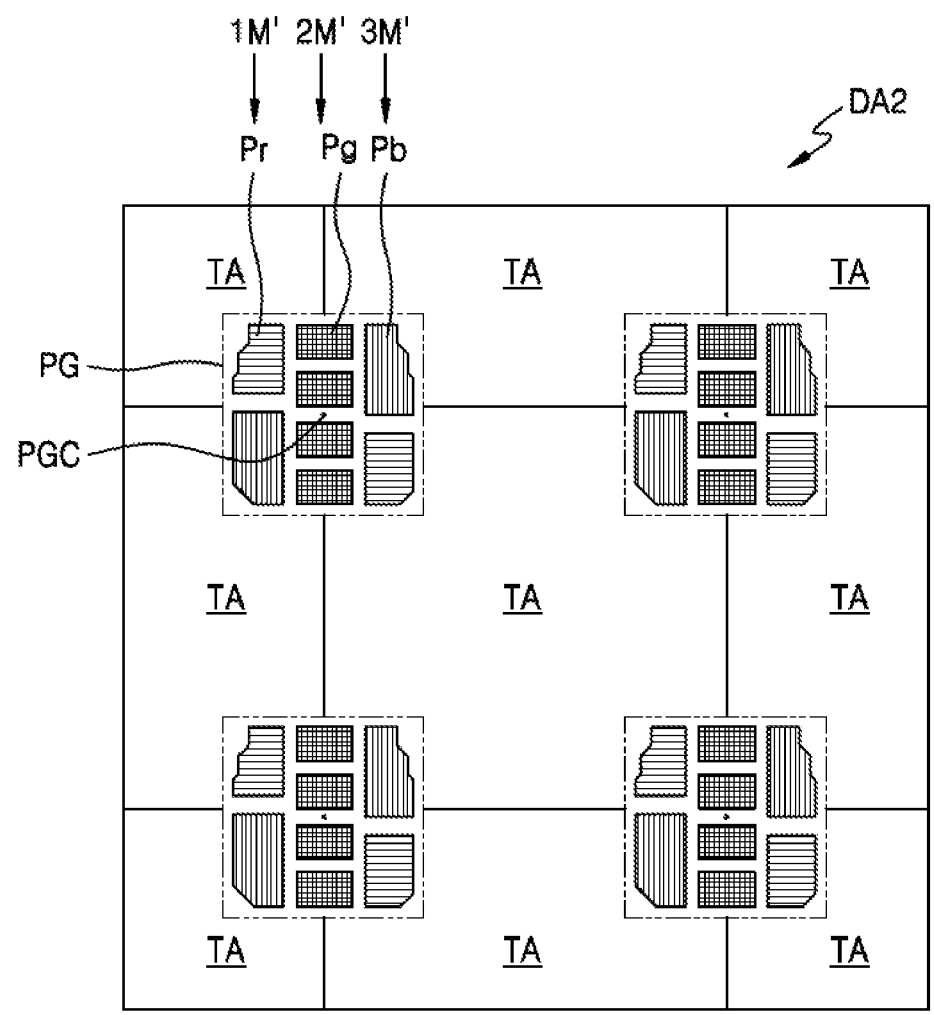

FIGS. 7A and 7B are plan views of a portion of a second display region DA2 of a display panel, according to an embodiment.

Referring to FIGS. 7A and 7B, pixel groups PG may be spaced apart from each other in the second display region DA2. Each of the pixel groups PG may be surrounded by the transmission region TA, and may include pixels emitting light of different colors, for example, the red pixel Pr, the green pixel Pg, and the blue pixel Pb. In an embodiment, each of the pixel groups PG may include two red pixels Pr, four green pixels Pg, and two blue pixels Pb.

As described above with reference to FIG. 6, the red pixel Pr, the green pixel Pg, and the blue pixel Pb may respectively emit red, green, and blue light by using a light-emitting diode arranged in a corresponding pixel, and thus, structuring of pixels may correspond to structuring of light-emitting diodes, which are display elements. Thus, the pixel group PG described with reference to FIGS. 7A and 7B may correspond to a display element group including a light-emitting diode emitting red light, a light-emitting diode emitting green light, and a light-emitting diode emitting blue light. For example, that the pixel groups PG each including the red pixel Pr, the green pixel Pg, and the blue pixel Pb are spaced apart from each other may indicate that display element groups each including light-emitting diodes emitting red, green, and blue light are spaced apart from each other.

The pixel group PG may be symmetrically arranged with respect to a center PGC of the pixel group PG. For example, the red pixel Pr and the blue pixel Pb may be arranged in a first column 1M', and four green pixels Pg may be spaced apart from each other by a certain distance in a second column 2M'. Also, the blue pixel Pb and the red pixel Pr may be arranged in a third column 3M'. In this case, the red pixel Pr arranged in the first column 1M' and the red pixel Pr arranged in the third column 3M' may be symmetrically arranged with respect to the center PGC of the pixel group PG. The blue pixel Pb arranged in the first column 1M' and the blue pixel Pb arranged in the third column 3M' may be symmetrically arranged with respect to the center PGC of the pixel group PG. Green pixels PG arranged in the second column 2M' may be symmetrically arranged with respect to the center PGC of the pixel group PG.

In an embodiment, a y-direction length of the blue pixel Pb may be greater than a y-direction length of the red pixel Pr. The y-direction length of the blue pixel Pb may be greater than or equal to the sum of y-direction lengths of two green pixels Pg.

Referring to FIG. 7A, the red pixel Pr, the green pixel Pg, and the blue pixel Pb may each be substantially a quadrangle on a plane. For example, the red pixel Pr and the blue pixel Pb may each have a quadrangular shape having a short side in an x direction and a long side in in a y direction. The green pixel Pg may have a quadrangular shape having a long side in the x direction and a short side in the y direction.

In an embodiment, referring to FIG. 7B, at least one of the red pixel Pr, the green pixel Pg, and the blue pixel Pb may be an n-gon, where n is a natural number of 5 or more. For example, although the green pixel Pg may have a quadrangular shape as shown in FIG. 7A, as shown in FIG. 7B, the red pixel Pr and the blue pixel Pb may each have an edge bent at least once, the edge being adjacent to the transmission region TA, and thus, may have an n-gon shape on a plane, where n is a natural number of 5 or more.

Figure 8:
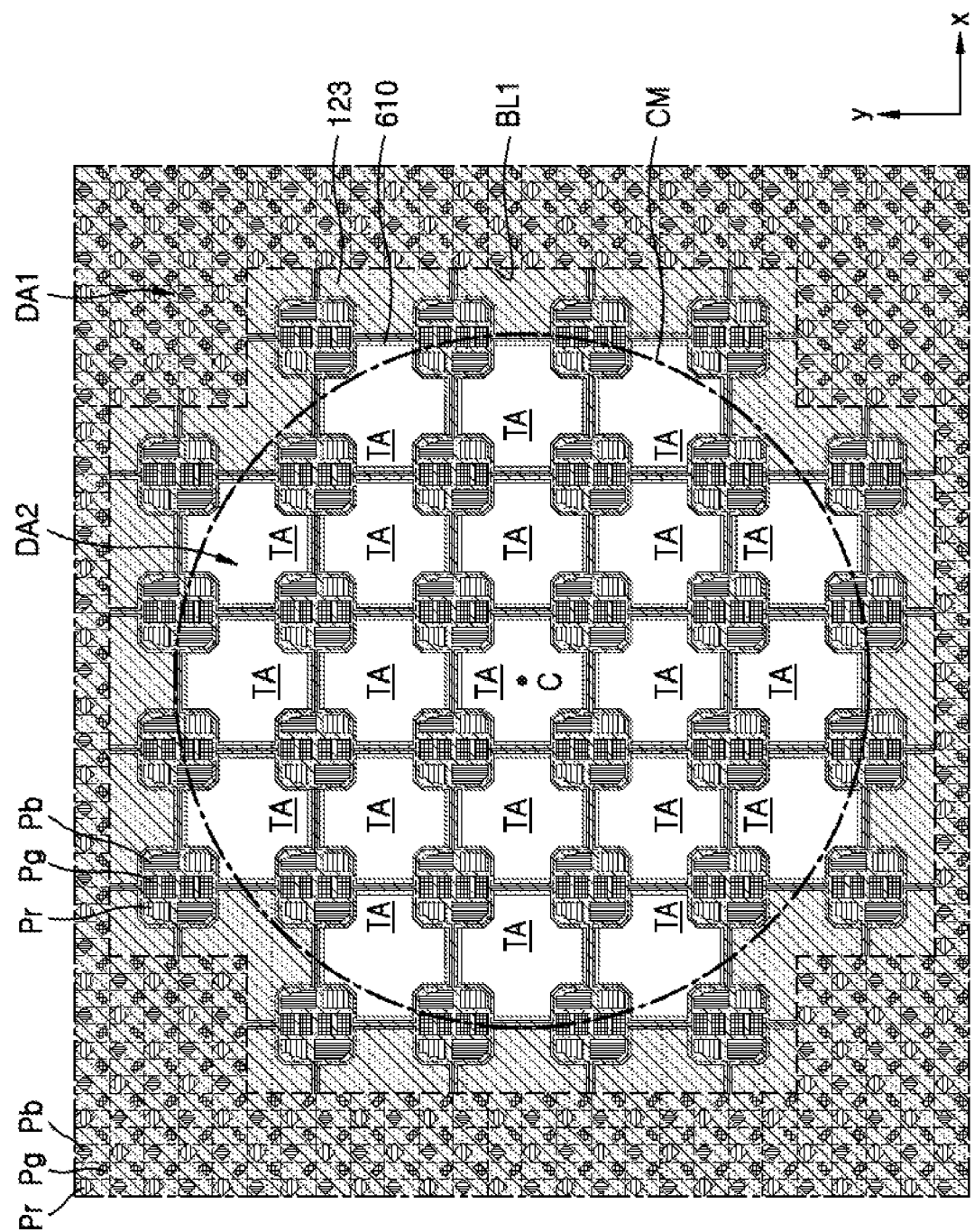
FIG. 8 is a plan view of a second display region of a display panel and a first display region around the second display region, according to an embodiment.
Figure 9:
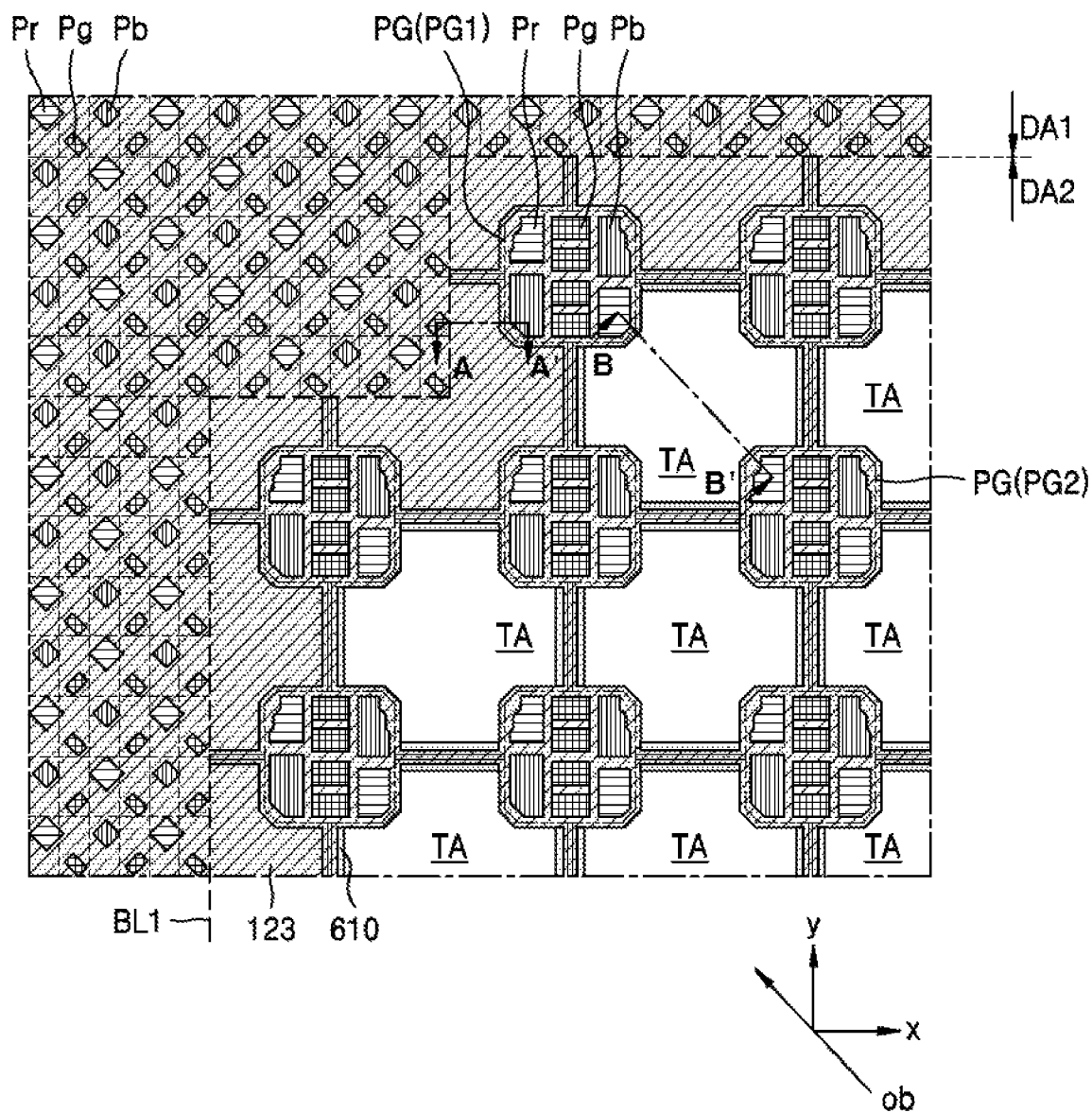
FIG. 9 is a plan view of a portion of FIG. 8.

FIG. 8 is a plan view of a second display region of a display panel and a first display region DA1 around the second display region DA2, according to an embodiment, and FIG. 9 is a plan view of a portion of FIG. 8.

Referring to FIGS. 8 and 9, the red, green and blue pixels Pr, Pg, and Pb are arranged in the first display region DA1 and the second display region DA2. The structuring of the red, green and blue pixels Pr, Pg, and Pb arranged in the first display region DA1 may be identical to or different from the structuring of the red, green, and blue pixels Pr, Pg, and Pb arranged in the second display region DA2. In an embodiment, FIGS. 8 and 9 illustrate that the structuring of the pixels in the first display region DA1 and the structuring of the pixels in the second display region DA2 are different from each other, and a detailed structure is the same as that described with reference to FIGS. 6, 7A, and 7B. In an embodiment, the red, green, and blue pixels Pr, Pg, and Pb arranged in each pixel group PG of the second display region DA2 may have a diamond pentile structure as described above with reference to FIG.

A borderline BL1 between the first display region DA1 and the second display region DA2 may have a polygonal shape on a plane, as illustrated in FIG. 8. In an embodiment, FIG. 8 illustrates that the borderline BL1 is a polygon having 12 sides, e.g., approximately a cross, and a corner portion of the polygon may have a step configuration. In an embodiment, the number of sides of the borderline BL1 may be less than or greater than 12. For example, the borderline BL1 between the first display region DA1 and the second display region DA2 may have four sides such as a quadrangle, or the borderline BL1 may be a polygon having more than 12 sides.

Referring to FIG. 9, pixels of the first display region DA1 and pixels of the second display region DA2 are spaced apart from each other by a certain distance, and the distance may be greater than a distance between neighboring pixels arranged in the first display region DA1 and may be greater than neighboring pixels arranged in one pixel group PG in the second display region DA2. A cross-sectional structure of the pixels arranged in the first and second display regions DA1 and DA2 are described with reference to FIGS. 10, 11A, 11B and 11C.

A transmission region TA may be located in the second display region DA2. In this case, the transmission region TA may have various shapes. For example, the transmission region TA may have a polygonal shape on a plane. In an embodiment, although not shown in the drawings, the transmission region TA may be circular or oval.

The transmission region TA may be defined by an edge of a layer including a light-blocking material. A display panel may include the light-blocking layer 610, which is included in an anti-reflective layer, as a layer including a light-blocking material, and the blocking metal layer BML arranged under the pixel circuit PC as described below, e.g., in reference to FIG. 10.

The transmission region TA is a region through which light and/or sound may transmit as described above with reference to FIG. 4. A component CM may be arranged to overlap the transmission region TA as illustrated by a dotted line in FIG. 8.

Some regions between neighboring pixel groups PG in the second display region DA2 may overlap an upper insulating layer 123 and the light-blocking layer 610, and other regions may not overlap either one of the upper insulating layer 123 and the light-blocking layer 610. In an embodiment, although not shown in the drawings, the upper insulating layer 123 and the light-blocking layer 610 may not overlap in a region between the pixel groups PG arranged in the second display region DA2. That is, all spaces between the pixel groups PG arranged in a portion corresponding to the second display region DA2 with respect to the borderline BL1 may be the transmission region TA. However, for convenience of description, a case where some regions between neighboring pixel groups PG in the second display region DA2 overlap the upper insulating layer 123 and the light-blocking layer 610 is mainly described in detail.

The transmission region TA may be arranged in the second display region DA2. Referring to FIG. 9, the transmission region TA may be arranged between a pixel, e.g., red pixel Pr, of a first pixel group PG1 and a pixel, e.g., red pixel Pr, of a second pixel group PG2, which are arranged in an ob direction. Because a light-emitting diode is located in a pixel, it may be seen that the transmission region TA is located between a light-emitting diode of one display element group and a light-emitting diode of another display element group. The ob direction of FIG. 9 may be a direction intersecting an x direction and a y direction.

Figure 10:
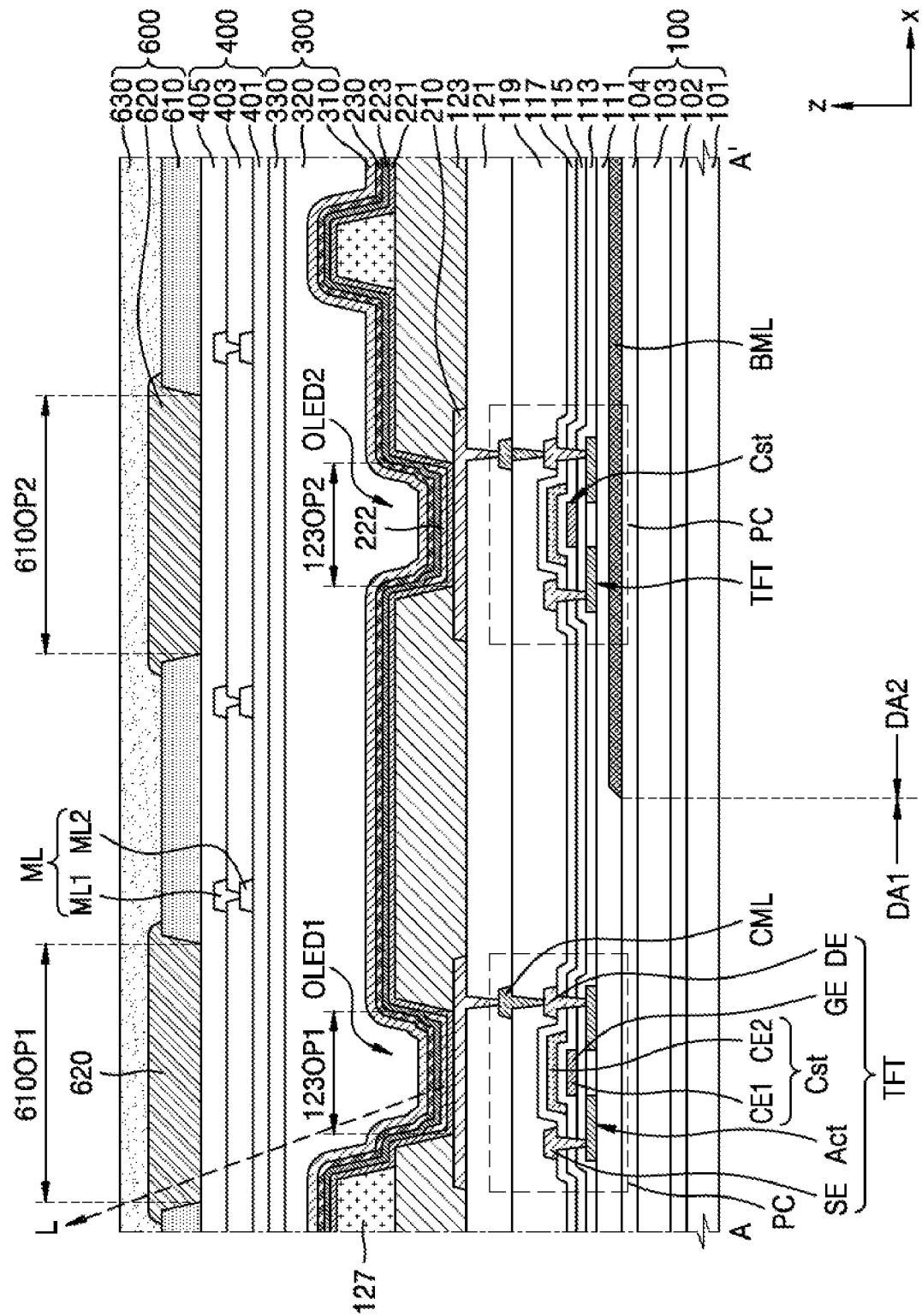
FIG. 10 is a cross-sectional view taken along line A-A' of FIG. 9.

FIG. 10 is a cross-sectional view taken along line A-A' of FIG. 9. FIG. 10 illustrates a case where a light-emitting diode of a display panel includes an organic light-emitting diode. An organic light-emitting diode may be arranged as a light-emitting diode in each of the first and second display regions DA1 and DA2. For convenience of description, an organic light-emitting diode arranged in the first display region DA1 is referred to as a first organic light-emitting diode OLED1, and an organic light-emitting diode arranged in the second display region DA2 is referred to as a second organic light-emitting diode OLED2.

Referring to FIG. 10, the first organic light-emitting diode OLED1 and the second organic light-emitting diode OLED2 are formed above the substrate 100.

The substrate 100 may include a first base layer 101, a first barrier layer 102, a second base layer 103, and a second barrier layer 104. The first base layer 101 and the second base layer 103 may include a polymer resin, and the first barrier layer 102 and the second barrier layer 104 may each include an inorganic insulation material. The polymer resin may include polyether sulfone, polyacrylate, polyether imide, polyethylene naphthalate, polyethylene terephthalate, polyphenylene sulfide, polyarylate, polyimide, polycarbonate, and/or cellulose acetate propionate.

The buffer layer 111 is arranged on the substrate 100. The buffer layer 111 may reduce or block penetration of foreign substances, moisture, or external air from a lower portion of the substrate 100. The buffer layer 111 may include an inorganic insulation material such as silicon oxide, silicon oxynitride, or silicon nitride, and may have a single-layer structure or a multi-layer structure, each including the material.

The blocking metal layer BML may be arranged between the substrate 100 and the buffer layer 111, and may be located in the second display region DA2. The blocking metal layer BML may prevent light, which travels toward the component CM (shown in FIG. 8) arranged in the second display region DA2 or is emitted from the component CM (shown in FIG. 8), from affecting an electronic element such as the thin-film transistor TFT of the pixel circuit PC. The blocking metal layer BML may include a metal having conductivity such as aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first organic light-emitting diode OLED1 and the second organic light-emitting diode OLED2 may be respectively electrically connected to pixel circuits PC. The first organic light-emitting diode OLED1 may be electrically connected to a pixel circuit PC between the substrate 100 and the first organic light-emitting diode OLED1, and the second organic light-emitting diode OLED2 may be electrically connected to a pixel circuit PC between the substrate 100 and the second organic light-emitting diode OLED2.

The pixel circuit PC may include the thin-film transistor TFT and the storage capacitor Cst. The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A gate insulating layer 113 is arranged between the semiconductor layer Act and the gate electrode GE, and a first insulating interlayer 115 and a second insulating interlayer 117 may be arranged between the gate electrode GE and the source electrode SE or between the gate electrode GE and the drain electrode DE.

The storage capacitor Cst may be arranged to overlap the thin-film transistor TFT. The storage capacitor Cst may include a lower electrode CE1 and an upper electrode CE2 overlapping each other. In some embodiments, the gate electrode GE of the thin-film transistor TFT may include the lower electrode CE1 of the storage capacitor Cst. The first insulating interlayer 115 may be arranged between the lower electrode CE1 and the upper electrode CE2.

The semiconductor layer Act may include polysilicon. In some embodiments, the semiconductor layer Act may include amorphous silicon. In some embodiments, the semiconductor layer Act may include an oxide semiconductor of at least one material selected from indium (In), gallium (Ga), stanium (Sn), zirconium (Zr), vanadium (V), hafnium (Hf), cadmium (Cd), germanium (Ge), chromium (Cr), titanium (Ti), and zinc (Zn). The semiconductor layer Act may include a channel region, an impurity-doped source region, and a drain region.

The gate insulating layer 113 may include an inorganic insulation material such as silicon oxide, silicon oxynitride, and/or silicon nitride, and may be of a single-layer structure or a multi-layer structure, each including the above-mentioned material.

The gate electrode GE or the lower electrode CE1 may include a low-resistance conductive material such as molybdenum (Mo), aluminum (Al), copper (Cu), and/or titanium (Ti), and may be of a single-layer structure or a multi-layer structure, each including the above-mentioned material.

The first insulating interlayer 115 may include an inorganic insulation material such as silicon oxide, silicon oxynitride, and/or silicon nitride, and may be of a single-layer structure or a multi-layer structure, each including the above-mentioned material.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may be of a single-layer structure or a multi-layer structure, each including the above-mentioned material.

The second insulating interlayer 117 may include an inorganic insulation material such as silicon oxide, silicon oxynitride, and/or silicon nitride, and may be of a single-layer structure or a multi-layer structure, each including the above-mentioned material.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may be of a single-layer structure or a multi-layer structure, each including the above-mentioned material. For example, the source electrode SE and/or the drain electrode DE may be of a three-layer structure of a titanium layer/aluminum layer/titanium layer.

A first organic insulating layer 119 is located above the thin-film transistor TFT, and the thin-film transistor TFT may be electrically connected to a first electrode 210 of a corresponding organic light-emitting diode through a connection electrode layer CML arranged on the first organic insulating layer 119. The connection electrode layer CML may be connected to the thin-film transistor TFT through a contact hole of the first organic insulating layer 119, and the first electrode 210 may be connected to the connection electrode layer CML through a contact hole of a second organic insulating layer 121.

The first organic insulating layer 119 and/or the second organic insulating layer 121 may include an organic insulation material such as acryl, benzocyclobutene (BCB), polyimide, or hexamethyldisiloxane (HMDSO). In some embodiments, the connection electrode layer CML and the second organic insulating layer 121 may be omitted, and in this case, the first electrode 210 may be directly connected to the thin-film transistor TFT through the contact hole of the first organic insulating layer 119.

The first organic light-emitting diode OLED1 and the second organic light-emitting diode OLED2 may each include an overlapping structure of the first electrode 210, an emission layer 222, and a second electrode 230. The overlapping structure may include a first functional layer 221 between the first electrode 210 and the emission layer 222 and/or a second functional layer 223 between the emission layer 222 and the second electrode 230.

The first electrode 210 may be located on the second organic insulating layer 121. The first electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The first electrode 210 may include a reflective film including the above-mentioned material and a transparent conductive film arranged above or/and under the reflective film. The transparent conductive film may include, for example, indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first electrode 210 may have a three-layer structure of an ITO layer/Ag layer/ITO layer.

The upper insulating layer 123 may include an opening covering an edge of the first electrode 210 and overlapping the first electrode 210. In this regard, FIG. 10 illustrates an opening 123OP1, sometimes referred to as a first opening, overlapping the first electrode 210 of the first organic light-emitting diode OLED1 and an opening 123OP2, sometimes referred to as a second opening, overlapping the first electrode 210 of the second organic light-emitting diode OLED2.

The first opening 123OP1 and the second opening 123OP2 of the upper insulating layer 123 may respectively define emission regions of the first and second organic light-emitting diodes OLED1 and OLED2. For example, a width of the first opening 123OP1 of the upper insulating layer 123 may correspond to a width of an emission region of the first organic light-emitting diode OLED1, and a width of the second opening 123OP2 of the upper insulating layer 123 may correspond to a width of an emission region of the second organic light-emitting diode OLED2.

The upper insulating layer 123 may be a transparent insulating layer. For example, the upper insulating layer 123 may include a transparent organic insulation material and/or inorganic insulation material.

In an embodiment, the upper insulating layer 123 is a colored insulating layer, and may have, for example, a black color. For example, the upper insulating layer 123 may include a polyimide (PI)-based binder and a pigment in which red, green, and blue are mixed. Alternatively, the upper insulating layer 123 may include a cardo-based binder resin and a mixture of lactam black pigment and blue pigment. Alternatively, the upper insulating layer 123 may include carbon black. The upper insulating layer 123 may prevent reflection of external light together with the anti-reflective layer 600 described below, and may improve contrast of the display panel. Hereinafter, for convenience of description, a case where the upper insulating layer 123 is a colored insulating layer is mainly described in detail.

A spacer 127 may be arranged on the upper insulating layer 123. The spacer 127 may include a material different from that of the upper insulating layer 123. For example, the upper insulating layer 123 may include a negative photosensitive material, whereas the spacer 127 may include includes a different material, such as a positive photosensitive material, and each of the upper insulating layer 123 and the spacer 127 may be formed through separate masking processes.

The emission layer 222 is located to correspond to each of the first opening 123OP1 and the second opening 123OP2 of the upper insulating layer 123, and may overlap the first electrode 210. The emission layer 222 may include a polymer or low-molecular weight organic material, which emits light of a certain color. The first functional layer 221 and the second functional layer 223 may be formed under and on the emission layer 222.

The first functional layer 221 may include a hole transport layer (HTL) and/or a hole injection layer (HIL). The second functional layer 223 may include an electron transport layer (ETL) and/or an electron injection layer (EIL). Unlike the emission layer 222, the first functional layer 221 and/or the second functional layer 223 may be entirely formed above the substrate 100. In other words, the first functional layer 221 and/or the second functional layer 223 may cover the first display region DA1 and the second display region DA2.

The encapsulation layer 300 may cover the first and second organic light-emitting diodes OLED1 and OLED2. In an embodiment, the encapsulation layer 300 may include a first inorganic encapsulation layer 310, a second inorganic encapsulation layer 330, and the organic encapsulation layer 320 between the first inorganic encapsulation layer 310 and the second inorganic encapsulation layer 330.

Each of the first and second inorganic encapsulation layers 310 and 330 may include at least one inorganic insulation material. The inorganic insulation material may include aluminum oxide, titanium oxide, tantalum oxide, hafnium oxide, zinc oxide, silicon oxide, silicon nitride, and/or silicon oxynitride.

The organic encapsulation layer 320 may include a polymer-based material. The polymer-based material may include, for example, an acrylic resin, an epoxy-based resin, polyimide, and polyethylene. For example, the organic encapsulation layer 320 may include an acrylic resin such as polymethyl methacrylate or polyacrylic acid. The organic encapsulation layer 320 may be formed by hardening a monomer or applying a polymer.

The input sensing layer 400 may include a touch electrode, and the touch electrode may include a metal line ML. The touch electrode may include the metal line ML of a mesh structure surrounding the emission regions of the first and second organic light-emitting diodes OLED1 and OLED2. The metal line ML may include a connection structure of a first metal layer ML1 and a second metal layer ML2, as shown in FIG. 10. In an embodiment, the metal line ML may include either one of the first metal layer ML1 and the second metal layer ML2. The metal line ML may include molybdenum (Mo), mendelevium (Md), silver (Ag), titanium (Ti), copper (Cu), aluminum (Al), and an alloy thereof.

An electrode of the input sensing layer 400, for example, the metal line ML, may be covered by the light-blocking layer 610.

The input sensing layer 400 may include a first touch insulating layer 401 on the encapsulation layer 300, a second touch insulating layer 403 on the first touch insulating layer 401, and a third touch insulating layer 405 on the second touch insulating layer 403. The first metal layer ML1 may be arranged between the second touch insulating layer 403 and the third touch insulating layer 405, and the second metal layer ML2 may be arranged between the first touch insulating layer 401 and the second touch insulating layer 403.

The first to third touch insulating layers 401, 403, and 405 may each include an inorganic insulation material and/or an organic insulation material. In an embodiment, the first touch insulating layer 401 and the second touch insulating layer 403 may each include an inorganic insulation material, and the third touch insulating layer 405 may include an organic insulation material.

The light-blocking layer 610 of the anti-reflective layer 600 may include an opening overlapping an emission region of each of the first and second organic light-emitting diodes OLED1 and OLED2. In this regard, FIG. 10 illustrates the opening 610OP1, sometimes referred to as a fourth opening, overlapping an emission region of the first organic light-emitting diode OLED1 and/or the first opening 123OP1 of the upper insulating layer 123, and the opening 610OP2, sometimes referred to as a fifth opening, overlapping an emission region of the second organic light-emitting diode OLED2 and/or the second opening 123OP2 of the upper insulating layer 123.

A width of the fourth opening 610OP1 of the light-blocking layer 610 may be greater than or equal to a width of the emission region of the first organic light-emitting diode OLED1 and/or the first opening 123OP1 of the upper insulating layer 123. In this regard, FIG. 10 illustrates that a width of the fourth opening 610OP1 of the light-blocking layer 610 is greater than a width of the emission region of the first organic light-emitting diode OLED1 and/or the first opening 123OP1 of the upper insulating layer 123. In this case, light L reaching a user's naked eyes, which forms an acute angle with a lower surface of the anti-reflective layer 600, may be sufficiently secured, and thus side visibility of the display panel may be increased.

Likewise, a width of the fifth opening 610OP2 of the light-blocking layer 610 may be greater than or equal to a width of the emission region of the second organic light-emitting diode OLED2 and/or the second opening 123OP2 of the upper insulating layer 123. In this regard, FIG. 10 illustrates that a width of the fifth opening 610OP2 of the light-blocking layer 610 is greater than a width of the emission region of the second organic light-emitting diode OLED2 and/or the second opening 123OP2 of the upper insulating layer 123.

Color filters 620 may be respectively located in the fourth opening 610OP1 and the fifth opening 610OP2 of the light-blocking layer 610. Each of the color filter 620 may have a color identical to a color of light emitted from a light-emitting diode arranged under the corresponding color filter 620. For example, as shown in FIG. 10, when any one first organic light-emitting diode OLED1 of the first display region DA1 emits green light, the color filter 620 arranged in the fourth opening 610OP1 to overlap the first organic light-emitting diode OLED1 may include a green color filter. Likewise, as shown in FIG. 10, when any one second organic light-emitting diode OLED2 of the second display region DA2 emits blue light, the color filter 620 arranged in the fifth opening 610OP2 to overlap the second organic light-emitting diode OLED2 may include a blue color filter.

The overcoat layer 630 may be arranged on the light-blocking layer 610 and the color filter 620. The overcoat layer 630 is a light-transmissive layer that does not have a color in a visible light band, and may planarize a lower surface of the light-blocking layer 610 and a lower surface of the color filter 620. The overcoat layer 630 may include a light-transmissive organic material such as an acrylic resin.

Figure 11A:
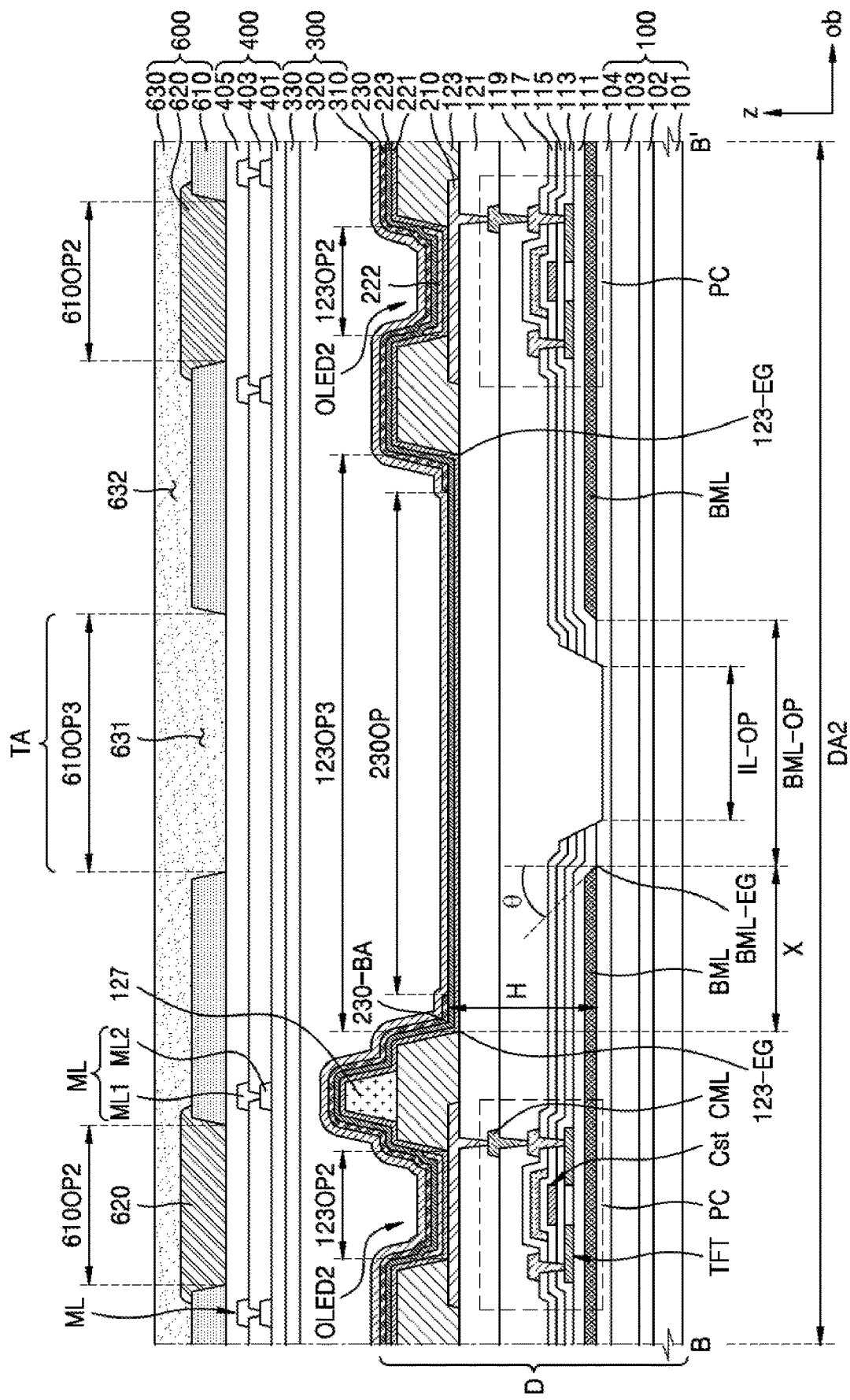
FIGS. 11A, 11B and 11C are each a cross-sectional view taken along line B-B' of FIG. 9.

FIG. 11A is a cross-sectional view taken along line B-B' of FIG. 9, and as shown in FIG. 9, illustrates a cross-sectional structure of a transmission region TA located outside among a plurality of transmission regions TA and surroundings of the transmission region TA.

Referring to FIG. 11A, the transmission region TA may be arranged between two neighboring second organic light-emitting diodes OLED2 among a plurality of second organic light-emitting diodes OLED2 arranged in the second display region DA2. Each of the second organic light-emitting diodes OLED2 may be electrically connected to the pixel circuit PC. The pixel circuit PC on the substrate 100 includes the thin-film transistor TFT and the storage capacitor Cst, and the second organic light-emitting diode OLED2 may have an overlapping structure of the first electrode 210, the emission layer 222, and the second electrode 230 and may be covered by the encapsulation layer 300. The input sensing layer 400 and the anti-reflective layer 600 may be arranged on the encapsulation layer 300 as described above.

The upper insulating layer 123 may include an opening 123OP3, sometimes referred to as a third opening, corresponding to the transmission region TA, and the light-blocking layer 610 may include the opening 610OP3, sometimes referred to as a sixth opening, corresponding to the transmission region TA. A portion of the overcoat layer 630 may be located in the sixth opening 610OP3. For example, a first portion 631 of the overcoat layer 630 may at least partially fill the sixth opening 610OP3, and a second portion 632 integrally formed with the first portion 631 may entirely cover the light-blocking layer 610 and the color filters 620.

The sixth opening 610OP3 overlaps the third opening 123OP3, and on a plane, a size, e.g., a width, of the sixth opening 610OP3 may be smaller than a size, e.g., a width, of the third opening 123OP3. The first and second functional layers 221 and 223 may also exist in a portion corresponding to the transmission region TA. In contrast, the second electrode 230 including a metal element may include an opening 230OP (hereinafter, referred to as a seventh opening) corresponding to the transmission region TA. A transmittance of the transmission region TA may be improved by the seventh opening 230OP. A size, e.g., a width, of the seventh opening 230OP of the second electrode 230 may be smaller than a size, e.g., a width, of the third opening 123OP3.

Some insulating layers, for example, inorganic insulating layers, among insulating layers arranged under the first electrode 210 may each include an opening corresponding to the transmission region TA. For example, a stack of the second barrier layer 104, the buffer layer 111, the gate insulating layer 113, the first insulating interlayer 115, and the second insulating interlayer 117 may include an inorganic insulation material, and the stack may include an opening IL-OP, sometimes referred to as an eighth opening, corresponding to the transmission region TA. A portion of the first organic insulating layer 119 arranged on the stack may exist in the eighth opening IL-OP. FIG. 11A illustrates that the eighth opening IL-OP includes an overlapping structure of through holes penetrating the buffer layer 111, the gate insulating layer 113, the first insulating interlayer 115, and the second insulating interlayer 117, and a blind hole of the second barrier layer 104. In an embodiment, the eighth opening IL-OP may not include the blind hole of the second barrier layer 104.

The blocking metal layer BML arranged between the substrate 100 and the pixel circuit PC includes an opening BML-OP, sometimes referred to as a ninth opening, overlapping the transmission region TA, and a size, e.g., a width, of the ninth opening BML-OP may be greater than a size, e.g., a width, of the eighth opening IL-OP of the stack of insulating layers. A size, e.g., a width, of the ninth opening BML-OP may be smaller than a size, e.g., a width, of the third opening 123OP3.

An edge of the blocking metal layer BML, which defines the ninth opening BML-OP, may be arranged closer to the transmission region TA than to an edge of the upper insulating layer 123, which defines the third opening 123OP3. An edge of inorganic insulating layers, which defines the eighth opening IL-OP, may be arranged closer to the transmission region TA than to an edge of the blocking metal layer BML, which defines the third opening 123OP3. An edge of the second electrode 230 may be arranged above the upper insulating layer 123. In this case, the edge of the second electrode 230 may be arranged in a region where the blocking metal layer BML is arranged, on a plane. In this case, the second electrode 230 may be bent above the upper insulating layer 123. For example, as described above, the upper insulating layer 123 includes the first opening 123OP1, the second opening 123OP2, and the third opening 123OP3, and an inner surface of each opening may have a tapered shape. In this case, the second electrode 230 is arranged above the upper insulating layer 123, and thus, may also be arranged in the first opening 123OP1, the second opening 123OP2, and the third opening 123OP3. In this case, the upper insulating layer 123 forming inner surfaces of the first opening 123OP1, the second opening 123OP2, and the third opening 123OP3 may be inclined such that the second electrode 230 may be bent.

In this case, on a plane, a distance X from a point at which the second electrode 230 arranged at a boundary between the upper insulating layer 123 and the second organic insulating layer 121 to an edge BML-EG of the blocking metal layer BML may have a certain range. For example, the distance X may be greater than a set distance defined by Equation 1 below.

$$Y = H \times \tan \theta \qquad \text{[Equation 1]}$$

Here, Y refers to a set distance, H refers to a height from a lower surface of the blocking metal layer BML to a lower surface of the second electrode 230 that is bent, and θ refers to one of angles of 45 degrees or less. Also, θ refers to an angle measured from a straight line perpendicular to the lower surface of the blocking metal layer BML, for example, a straight line parallel to a Z axis of FIG. 11A, to the tapered upper insulating layer 123.

In this regard, H may be variously set. For example, although not shown in FIG. 11A, when the second electrode 230 is arranged to directly contact the upper insulating layer 123, the second electrode 230 may be bent at an edge 123-EG of the upper insulating layer 123. In this case, H may be a height from the lower surface of the blocking metal layer BML to the edge 123-EG of the tapered upper insulating layer 123, or a height from the lower surface of the blocking metal layer BML to a lower surface of a bent point 230-BA of the second electrode 230 bent at the edge 123-EG of the tapered upper insulating layer 123. In an embodiment, as shown in FIG. 11A, when the first functional layer 221 and/or the second functional layer 223 is arranged between the upper insulating layer 123 and the second electrode 230, H may refer to a height from the lower surface of the blocking metal layer BML to the lower surface of the bent point 230-BA of the second electrode 230 bent at the edge 123-EG of the tapered upper insulating layer 123, or a distance from the edge 123-EG of the tapered upper insulating layer 123 to a flat upper surface of the first functional layer 221 and/or the second functional layer 223.

In this case, a value of H may be measured through a sensor or the like forming each layer, or may be a preset value. Hereinafter, for convenience of description, the value of H may be a preset value. Also, a value of θ may also be measured through a sensor or the like, or may be a preset value. When θ is measured through a sensor, θ may be calculated based on a range of a laser beam incident through the sensor on an upper surface of the substrate 100 when the laser is irradiated onto the substrate 100 and a location of the edge BML-EG of the blocking metal layer BML. In this case, θ may have a value of 45 degrees or less, as described above.

In this case, the edge BML-EG of the blocking metal layer BML may be tapered or non-tapered and may be in the form of a straight line. Also, an edge of the second electrode 230 may be arranged between a bent point of the second electrode 230 arranged at a boundary between the upper insulating layer 123 and the second organic insulating layer 121, i.e., the edge 123-EG of the upper insulating layer 123, and the edge BML-EG of the blocking metal layer BML.

In the display panel 10 as described above, a lower surface of the second electrode 230 may not be swollen or deformed, and thus, when each layer stacked on the second electrode 230 is formed, deformation or damage may not occur.

Figure 11B:
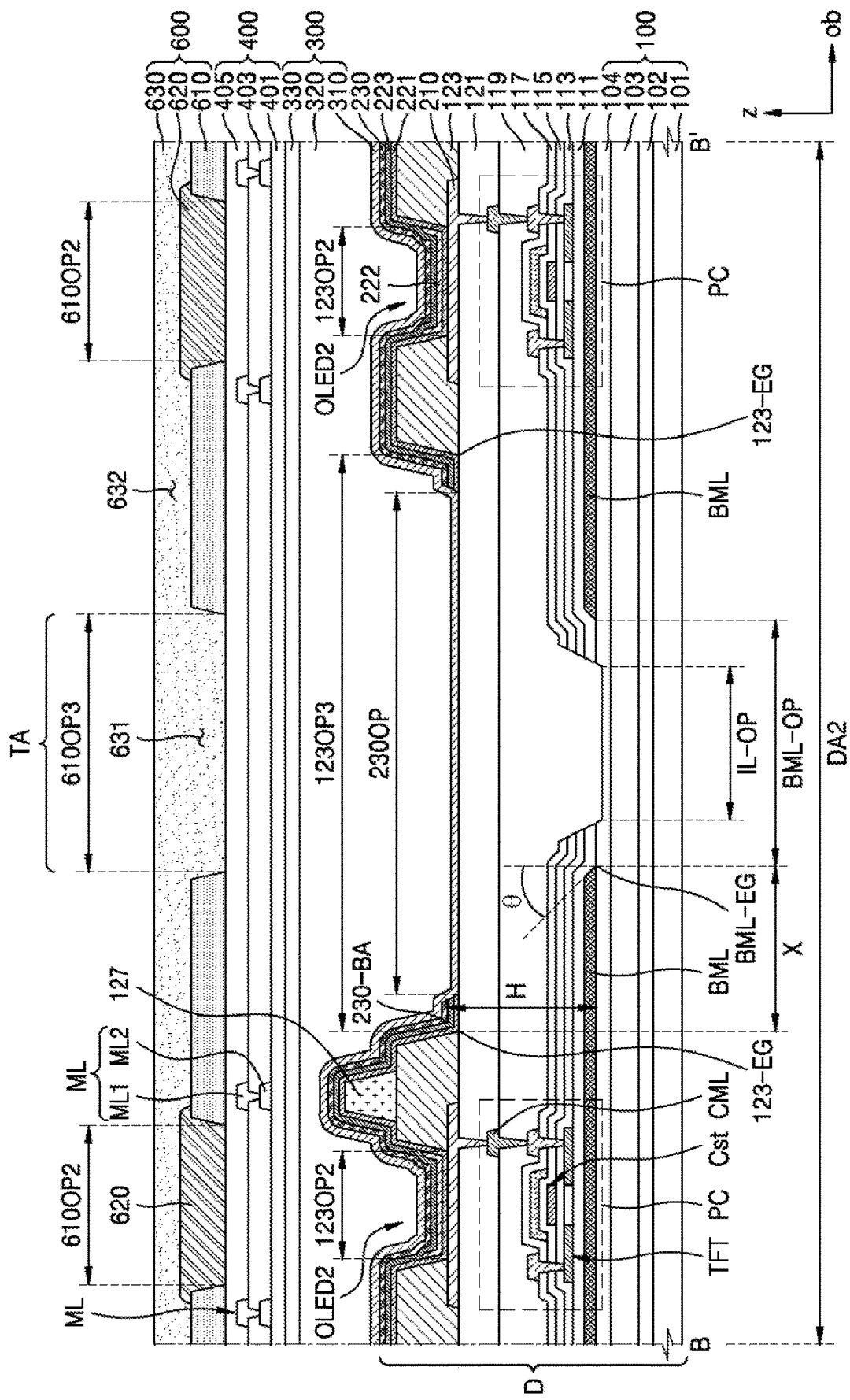

FIG. 11B is a cross-sectional view taken along the line B-B' of FIG. 9 in accordance with an embodiment, and as shown in FIG. 9, illustrates a cross-sectional structure of a transmission region TA located outside among a plurality of transmission regions TA and surroundings of the transmission region TA.

Referring to FIG. 11B, the transmission region TA may be arranged between two neighboring second organic light-emitting diodes OLED2 among a plurality of second organic light-emitting diodes OLED2 arranged in the second display region DA2. Each of the second organic light-emitting diodes OLED2 may be electrically connected to the pixel circuit PC. The pixel circuit PC on the substrate 100 includes the thin-film transistor TFT and the storage capacitor Cst, and the second organic light-emitting diode OLED2 may have an overlapping structure of the first electrode 210, the emission layer 222, and the second electrode 230 and may be covered by the encapsulation layer 300. In this case, the second organic light-emitting diode OLED2, the pixel circuit PC, and the encapsulation layer 300 may be respectively identical or similar to those described with reference to FIG. 11A. Hereinafter, differences from FIG. 11A are mainly described in detail.

The first functional layer 221, the second functional layer 223, and the second electrode 230 may not be arranged in the third opening 123OP3. In this case, the first inorganic encapsulation layer 310 is arranged above the upper insulating layer 123, and may be arranged to surround an edge of the first functional layer 221, the second functional layer 223, and the second electrode 230.

In this case, a distance X from a bend point of the second electrode 230 arranged at a boundary between the upper insulating layer 123 and the second organic insulating layer 121 to the edge BML-EG of the blocking metal layer BML may have a range according to Equation 1 described above.

Figure 11C:
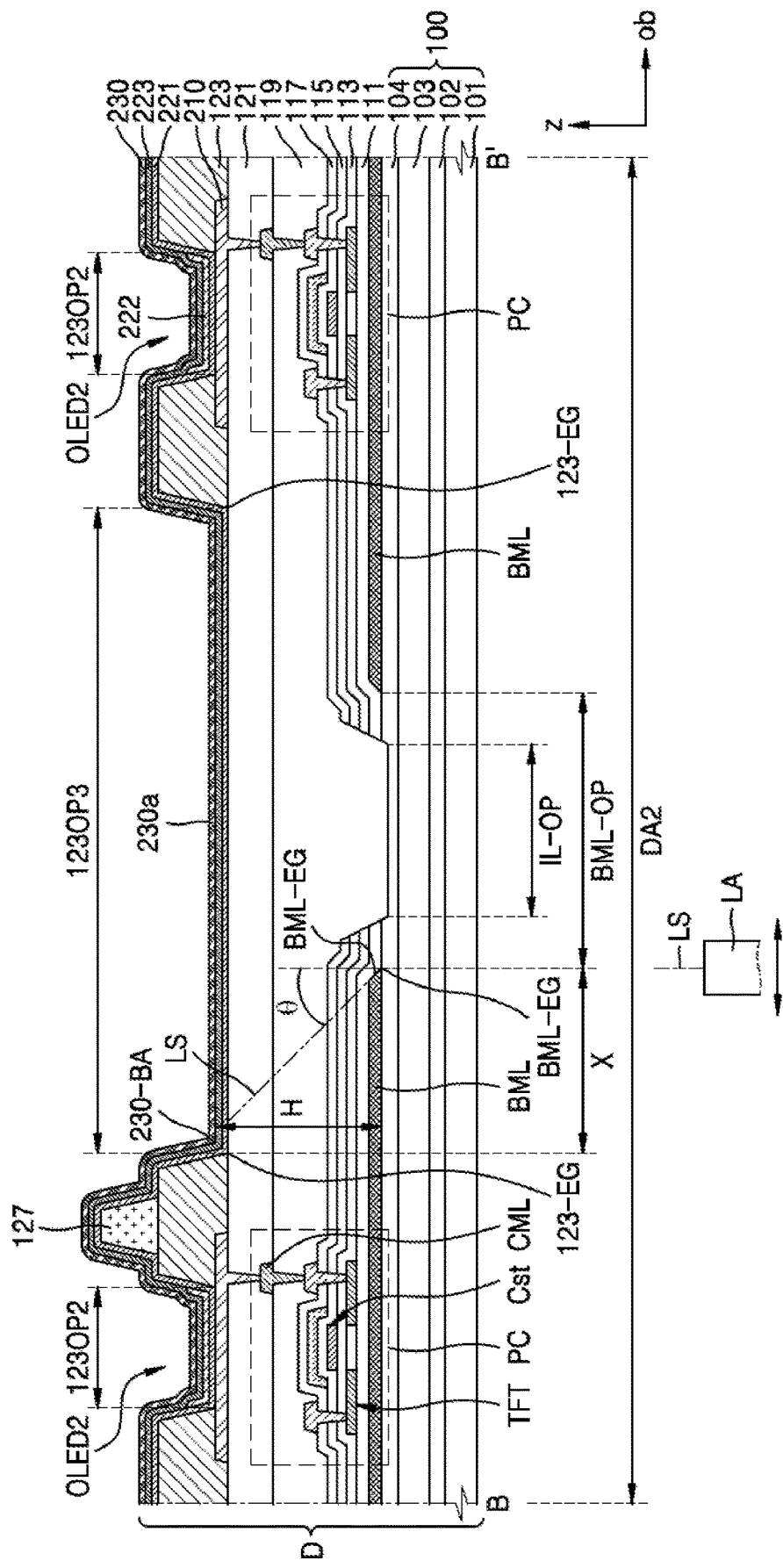

FIG. 11C is a cross-sectional view taken along the line B-B' of FIG. 9 in accordance with an embodiment, and as shown in FIG. 9, illustrates a cross-sectional structure of a transmission region TA located outside among a plurality of transmission regions TA and surroundings of the transmission region TA.

Referring to FIG. 11C, the display panel 10 is sequentially formed from the blocking metal layer BML to the upper insulating layer 123 on the substrate 100, and then, the first functional layer 221, the emission layer 222, the second functional layer 223, and the second electrode 230 are sequentially formed on the upper insulating layer 123 to manufacture a display substrate D.

Afterwards, the display substrate D is charged into a chamber (not shown), and then a laser beam is irradiated by using a laser irradiation apparatus LA, to remove a portion of the second electrode 230. Particularly, a laser beam LS of the laser irradiation apparatus LA may be irradiated to the second display region DA2, and may improve light transmittance of the transmission region TA by removing the second electrode 230 from a portion corresponding to the transmission region TA.

Specifically, the laser beam LS may be irradiated by the laser irradiation apparatus LA from a lower surface of the substrate 100. In this case, the laser irradiation apparatus LA may linearly move in at least one of a first direction and a second direction in a region corresponding to the second display region DA2. In an embodiment, the laser irradiation apparatus LA may perform a rotational motion or a reciprocating motion in a region corresponding to the second display region DA2. In this case, a cross-section of the laser beam LS perpendicular to an irradiation direction of the laser beam LS may be smaller than a size of the second display region DA2.

When the laser beam LS is irradiated to the second display region DA2, the blocking metal layer BML blocks the laser beam LS, thus preventing the second organic light-emitting diode OLED2 from being damaged by the laser beam LS.

A laser beam that has passed through a portion where the blocking metal layer BML is not arranged may reach the second electrode 230 arranged in a portion corresponding to the third opening 123OP3 to partially remove the second electrode 230. In this case, the laser beam may remove only the second electrode 230, or may remove all of the first functional layer 221, the second functional layer 223, and the second electrode 230.

When the laser beam LS is irradiated as described above, the laser beam LS may be diffracted at the edge BML-EG of the blocking metal layer BML. In this case, a path of the diffracted laser beam LS may be arranged in a certain angular range from the edge BML-EG of the blocking metal layer BML. For example, a path of the diffracted laser beam LS may be arranged in a range where a straight line perpendicular to a lower surface of the blocking metal layer BML, for example, a straight line parallel to a Z axis direction of FIG. 12C, and an angle measured in one direction from the straight line are within θ. Particularly, based on FIG. 12C, θ of the path of the diffracted laser beam LS may be measured in a left direction and a counterclockwise direction from a straight line perpendicular to the lower surface of the blocking metal layer BML. In this case, the laser beam LS diffracted at the edge BML-EG of the blocking metal layer BML may be arranged within a range of θ within 45 degrees.

The laser beam LS may travel to the bent point 230-BA of the second electrode 230, which is arranged at the tapered edge 123-EG of the upper insulating layer 123. In this case, energy is concentrated on the tapered edge 123-EG of the upper insulating layer 123 due to the diffracted laser beam LS, and thus, the bent point 230-BA of the second electrode 230, which is arranged at the tapered edge 123-EG of the upper insulating layer 123, may be spaced apart from the upper insulating layer 123 or a burr may occur. In this case, due to the second electrode 230 spaced apart from the upper insulating layer 123 or the burr of the second electrode 230, other layers arranged on the second electrode 230 may not adhere to the second electrode 230 or may not be formed on the second electrode 230, thus shortening the lifespan of the display panel 10.

However, when viewed on a plane, in a case where the bent point 230-BA of the second electrode 230, which is arranged at the tapered edge 123-EG of upper insulating layer 123, is arranged at a position exceeding a set distance calculated in Equation 1, the above-described problem may not occur. That is, the laser beam LS is not irradiated to the bent point 230-BA of the second electrode 230, which is arranged at the tapered edge 123-EG of the upper insulating layer 123, and thus, deformation of the second electrode 230 due to the irradiation of the laser beam LS may be decreased.

In this case, when the second electrode 230 is partially removed due to the irradiation of the laser beam LS, deformation of the second electrode 230 at the tapered edge of the upper insulating layer 123 may be prevented.

Figure 12A:
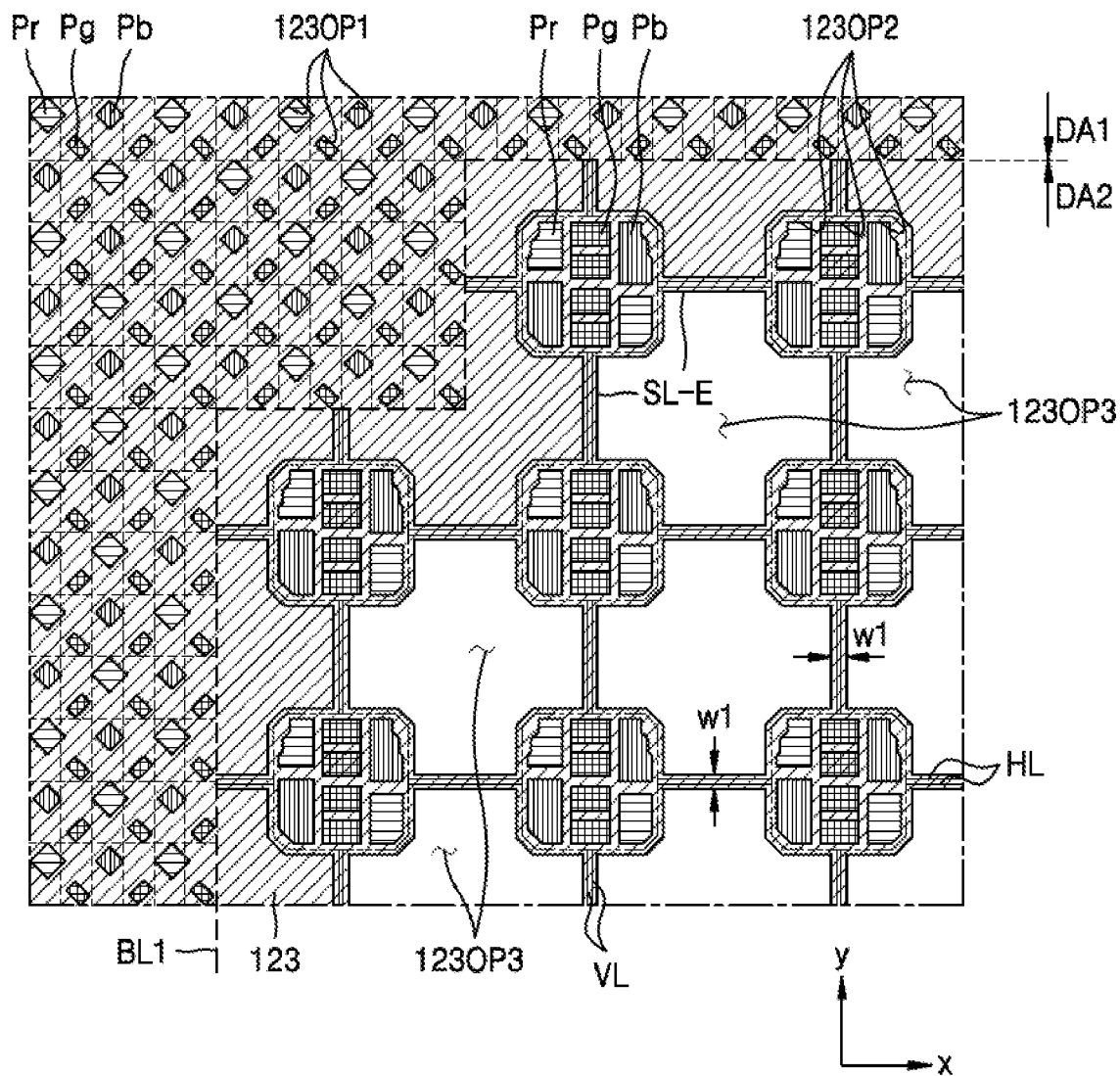
FIG. 12A is a plan view of an excerpt of an upper insulating layer in a display panel, according to an embodiment.
Figure 12B:
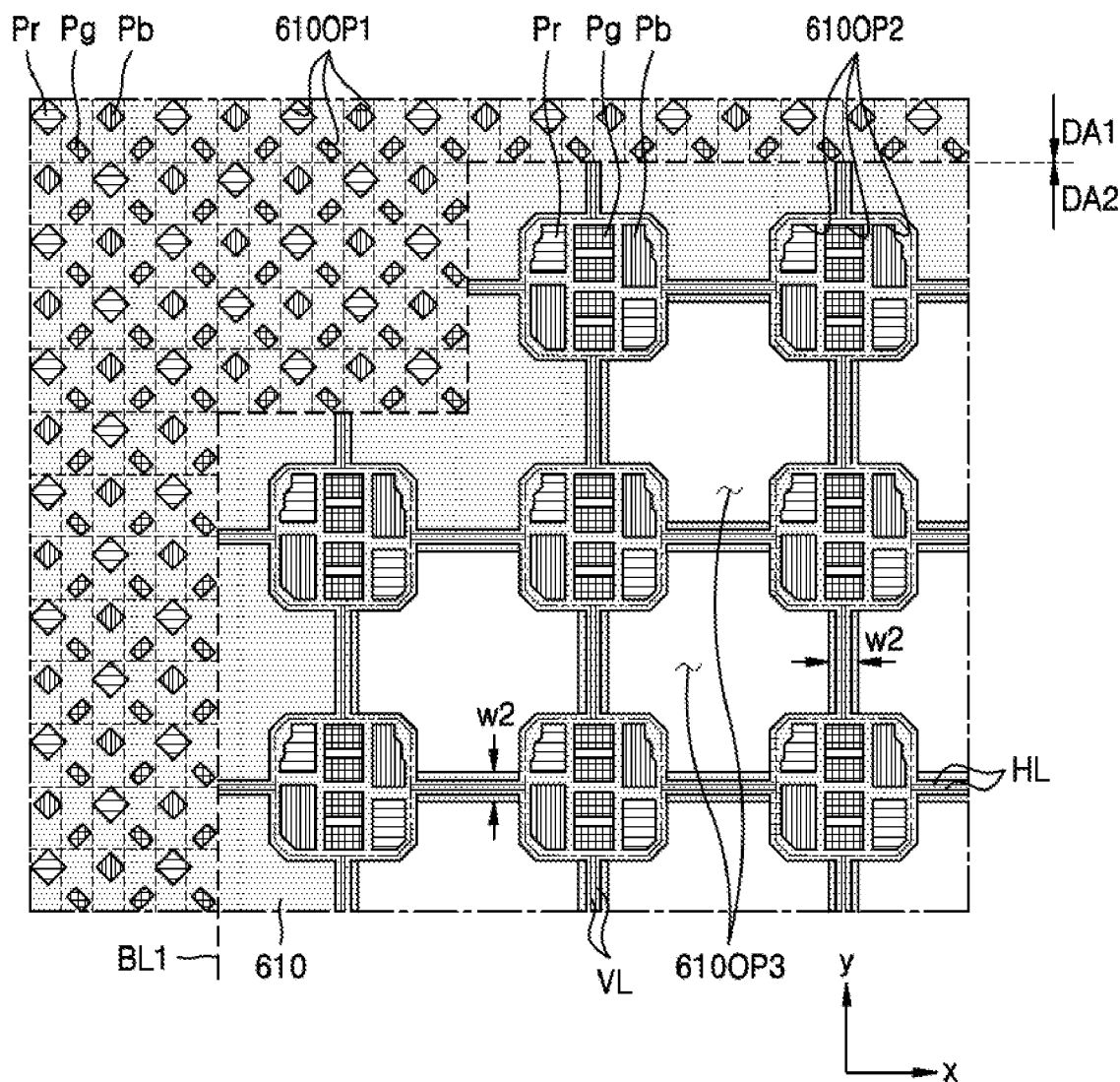
FIG. 12B is a plan view of an excerpt of a light-blocking layer in a display panel, according to an embodiment.

FIG. 12A is a plan view of an upper insulating layer of a display panel, according to an embodiment, and FIG. 12B is a plan view of a light-blocking layer of a display panel, according to an embodiment.

Referring to FIGS. 12A and 12B, the upper insulating layer 123 may include first and second openings 123OP1 and 123OP2 corresponding to pixels, for example, red, green, blue pixels Pr, Pg, and Pb. The structuring of the first openings 123OP1 may be substantially the same as the structuring of the pixels described with reference to FIG. 6. The structuring of the second openings 123OP2 may be substantially the same as the structuring of the pixels described with reference to FIGS. 7A and 7B.

The upper insulating layer 123 may include the third opening 123OP3 located in the second display region DA2. The third opening 123OP3 is arranged in a second inner display region of the second display region DA2, but may not exist in a second outer display region. For example, an opening may not be arranged between pixels of the first display region DA1 and the second display region DA2 arranged closest to the first display region DA1. Third openings 123OP3 may be arranged in an x direction, a y direction, and an ob direction in the second inner display region DA22.

The third openings 123OP3 may be spaced apart from each other. The upper insulating layer 123 may include a portion arranged between neighboring third openings 123OP3 in the x direction and the y direction, and the corresponding portion may cover a first wire HL, e.g., a lateral wire, extending in the x direction and a second wire VL, e.g., a vertical wire, extending in the y direction. The first wire HL may include a scan line described with reference to FIG. 5, and the second wire VL may include a data line and/or a driving voltage line.

Referring to FIG. 12B, the light-blocking layer 610 may include fourth and fifth openings 610OP1 and 610OP2 corresponding to pixels, for example, red, green, blue pixels Pr, Pg, and Pb. The structuring of the fourth openings 610OP1 may be substantially the same as the structuring of the first openings 123OP1. For example, the structuring of the fourth opening 610OP1 may be substantially the same as the structuring of the pixels described with reference to FIG. 6. The structuring of the fifth openings 610OP2 may be substantially the same as the structuring of the second openings 123OP2. For example, the structuring of the fifth openings 610OP2 may be substantially the same as the pixels described with reference to FIGS. 7A and 7B.

The light-blocking layer 610 may include the sixth opening 610OP3 located in the second display region DA2. In an embodiment, the sixth opening 610OP3 is arranged in a portion of the second display region DA2, and may not exist in another portion of the second display region DA2. Sixth openings 610OP3 may be arranged in an x direction, a y direction, and an ob direction in the second display region DA2. In an embodiment, although not shown, the sixth opening 610OP3 may be arranged in the entire second display region DA2.

The sixth openings 610OP3 may be spaced apart from each other. The light-blocking layer 610 may include a portion arranged between neighboring sixth openings 610OP3 in the x direction and the y direction, and the corresponding portion may cover the first wire HL extending in the x direction and the second wire VL extending in the y direction. The portion of the light-blocking layer 610 and a portion of the upper insulating layer 123, each covering the first wire HL and the second wire VL, overlap each other, but the widths may be identical to or different from each other. In this regard, FIG. 12A illustrates that a first width w1 of the portion of the upper insulating layer 123 is smaller than a second width w2 of the portion of the light-blocking layer 610 as illustrated in FIG. 12B, but the first width w1 may be greater than or equal to the second width w2.

Figure 13:
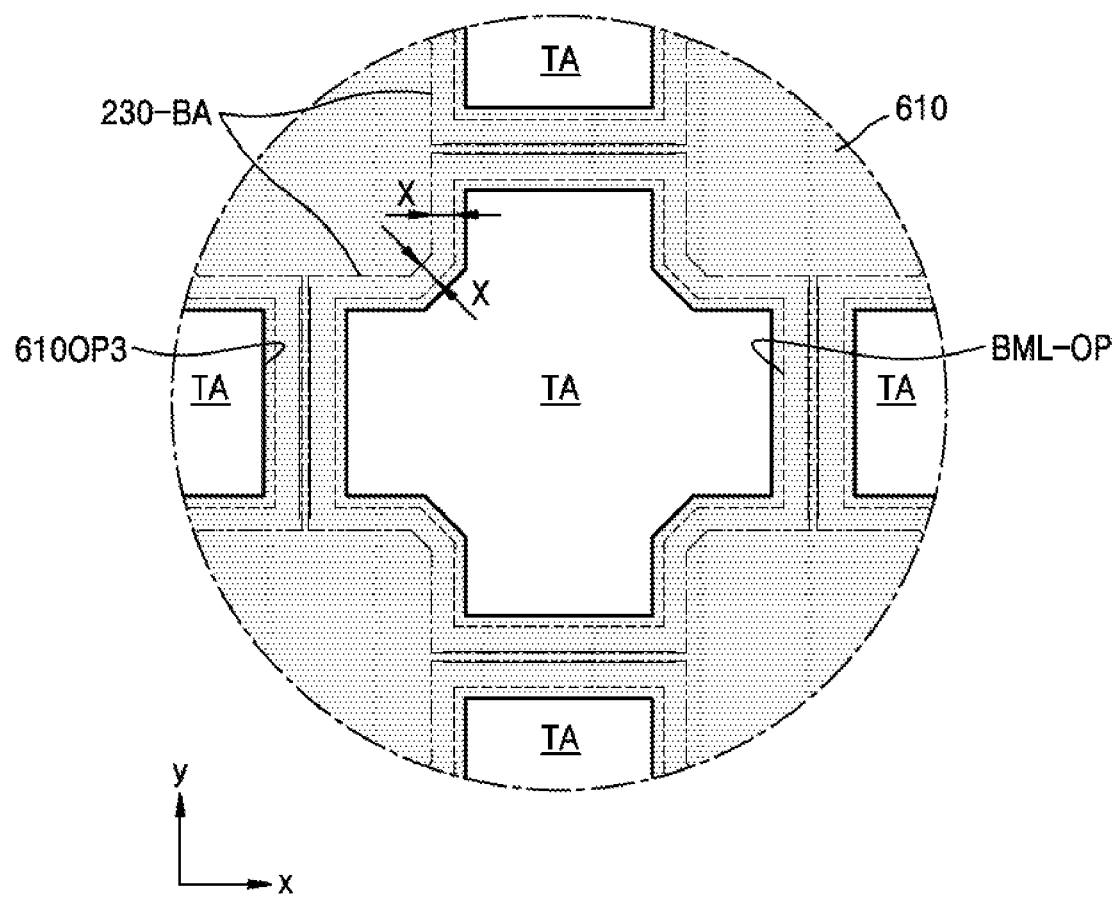
FIG. 13 is a plan view of a relationship between a transmission region, a bending point of a second electrode, a third opening, and a ninth opening, according to an embodiment.

FIG. 13 is a plan view of a relationship between a transmission region TA, a bending point 230-BA of a second electrode, a sixth opening 610OP3, and a ninth opening BML-OP, according to an embodiment.

Referring to FIG. 13, the transmission region TA may have a substantially cross shape in a plan view. The light-blocking layer 610 and the blocking metal layer BML, which are described above with reference to FIGS. 12A and 12B, may respectively include the sixth opening 610OP3 and the ninth opening BML-OP, each corresponding to the transmission region TA, and at least one of the sixth opening 610OP3 and the ninth opening BML-OP may include straight edges.

In an embodiment, an edge of the sixth opening 610OP3 and/or an edge of the ninth opening BML-OP may include straight edges. In other words, edges of the light-blocking layer 610, which define the sixth opening 610OP3, and/or edges of the blocking metal layer BML, which define the ninth opening BML-OP, may have a straight structure as shown in FIG. 13. In this case, the transmission region TA may include a straight edge on a plane.

In an embodiment, although not shown, the transmission region TA may include an edge of a repetitive concavo-convex structure. In this case, an edge of the sixth opening 610OP3 and/or an edge of the ninth opening BML-OP, each defining the transmission region TA, may have a concavo-convex structure. The transmission region TA having a concavo-convex structure as described above may prevent or minimize diffraction of light passing through the transmission region TA.

FIG. 13 illustrates that an edge of the transmission region TA has a straight line, but in an embodiment, the edge has a shape other than a straight line.

The transmission region TA may be defined by the light-blocking layer 610, as described above. In this case, an edge of the blocking metal layer BML may be arranged inside an edge of the light-blocking layer 610. That is, on a plane, the sixth opening 610OP3 may be arranged inside the ninth opening BML-OP. The sixth opening 610OP3 may define a border of the transmission region TA. In this case, the bent point 230-BA of the second electrode 230 may be arranged inside the ninth opening BML-OP. In this case, a distance X from a border of the ninth opening BML-OP to the bent point 230-BA of the second electrode 230 may be greater than a set distance defined in Equation 1 described above.

Figure 14A:
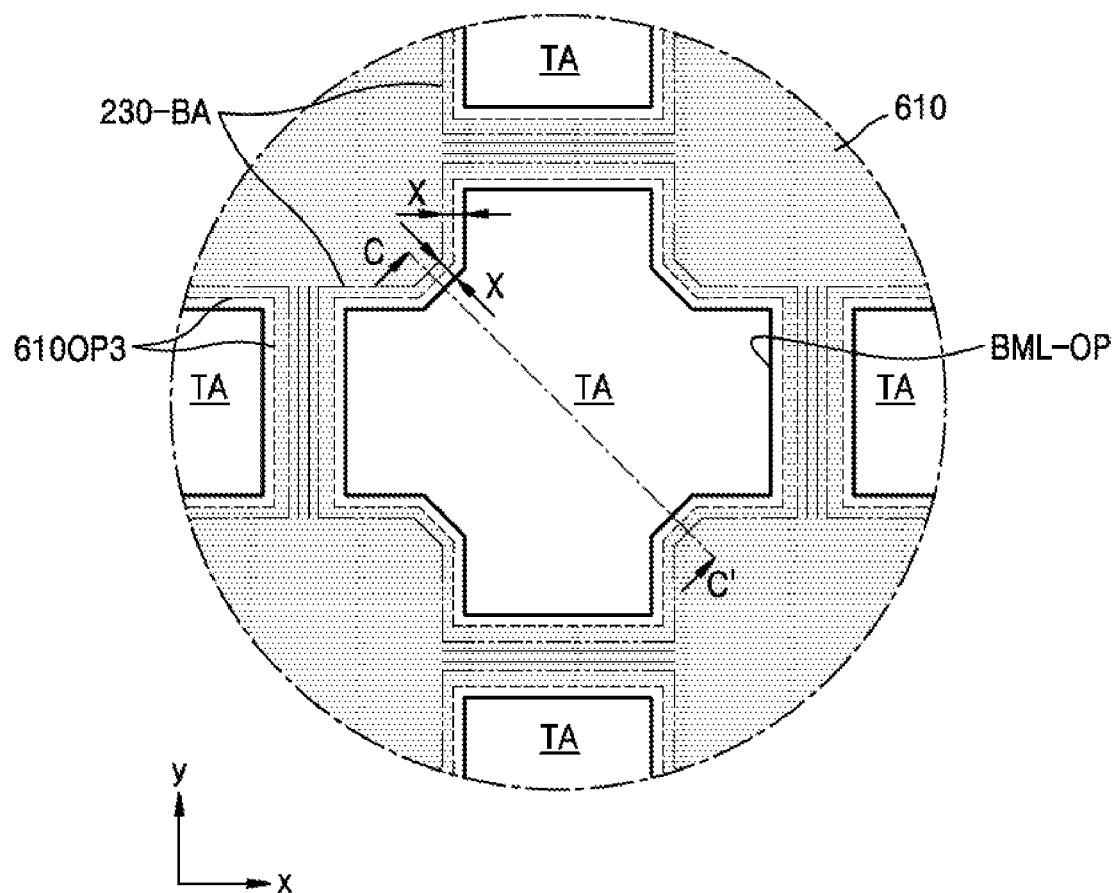
FIG. 14A is a plan view of a relationship between a transmission region, a bending point of a second electrode, a third opening, and a ninth opening, according to an embodiment.
Figure 14B:
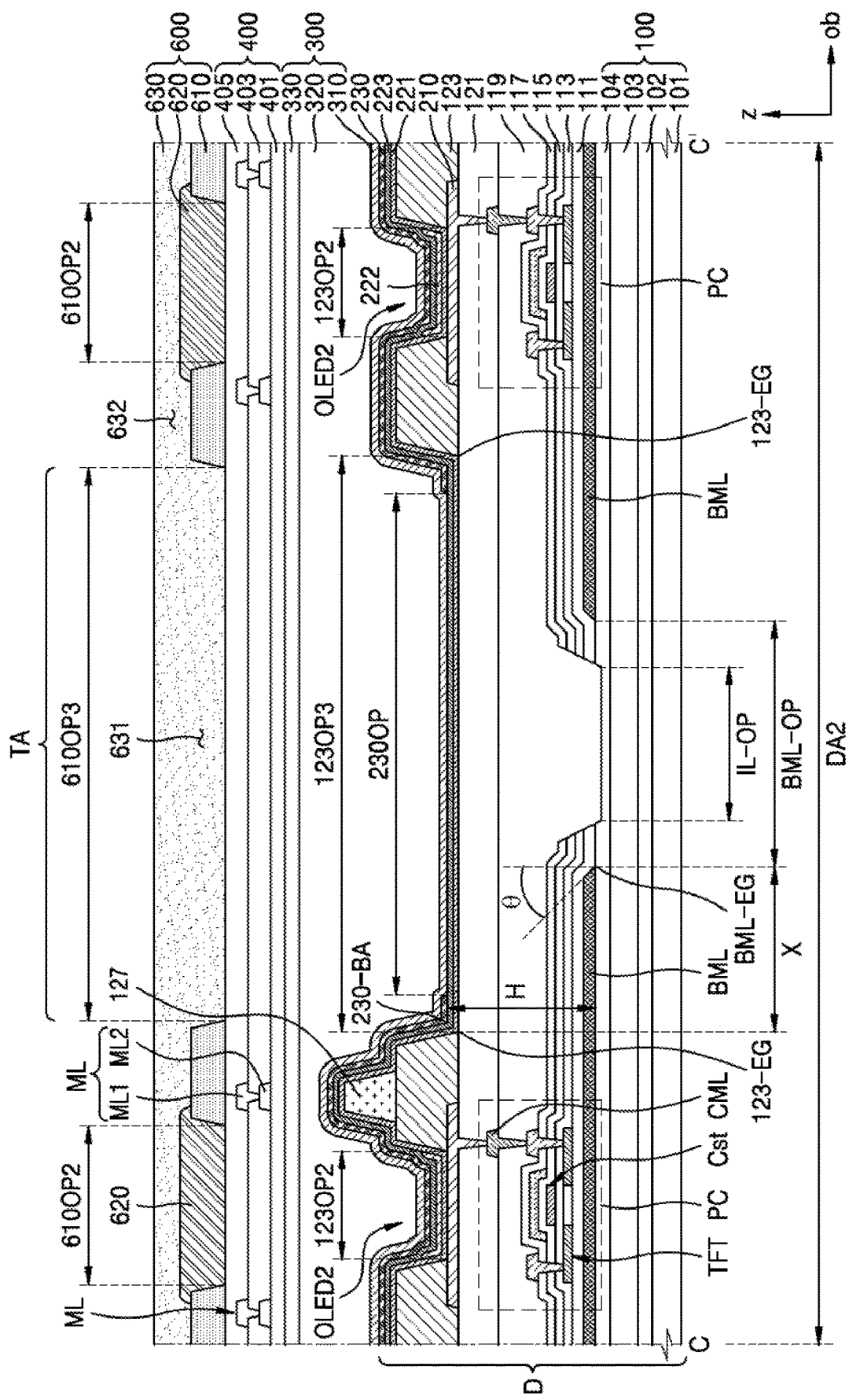
FIG. 14B is a cross-sectional view taken along line C-C' of FIG. 14A.

FIG. 14A is a plan view of a relationship between an upper insulating layer of a transmission region TA, a sixth opening 610OP3, and a ninth opening BML-OP, according to an embodiment, and FIG. 14B is a cross-sectional view taken along line C-C' of FIG. 14A.

Referring to FIGS. 14A and 14B, the transmission region TA may be similar to that illustrated in FIG. 13. In this case, the transmission region TA may be defined by an edge of the blocking metal layer BML, which forms the ninth opening BML-OP. In this case, the sixth opening 610OP3 and the bent point 230-BA of the second electrode 230 may be arranged inside the ninth opening BML-OP.

In this case, as shown in FIG. 14B, on a plane, the edge of the blocking metal layer BML may be arranged closer to a center of the transmission region TA than to an edge of the light-blocking layer 610.

In this case, on a plane, a distance X from the edge of the blocking metal layer BML to the bent point 230-BA of the second electrode 230 may be greater than a set distance calculated by Equation 1 described above.

Figure 15:
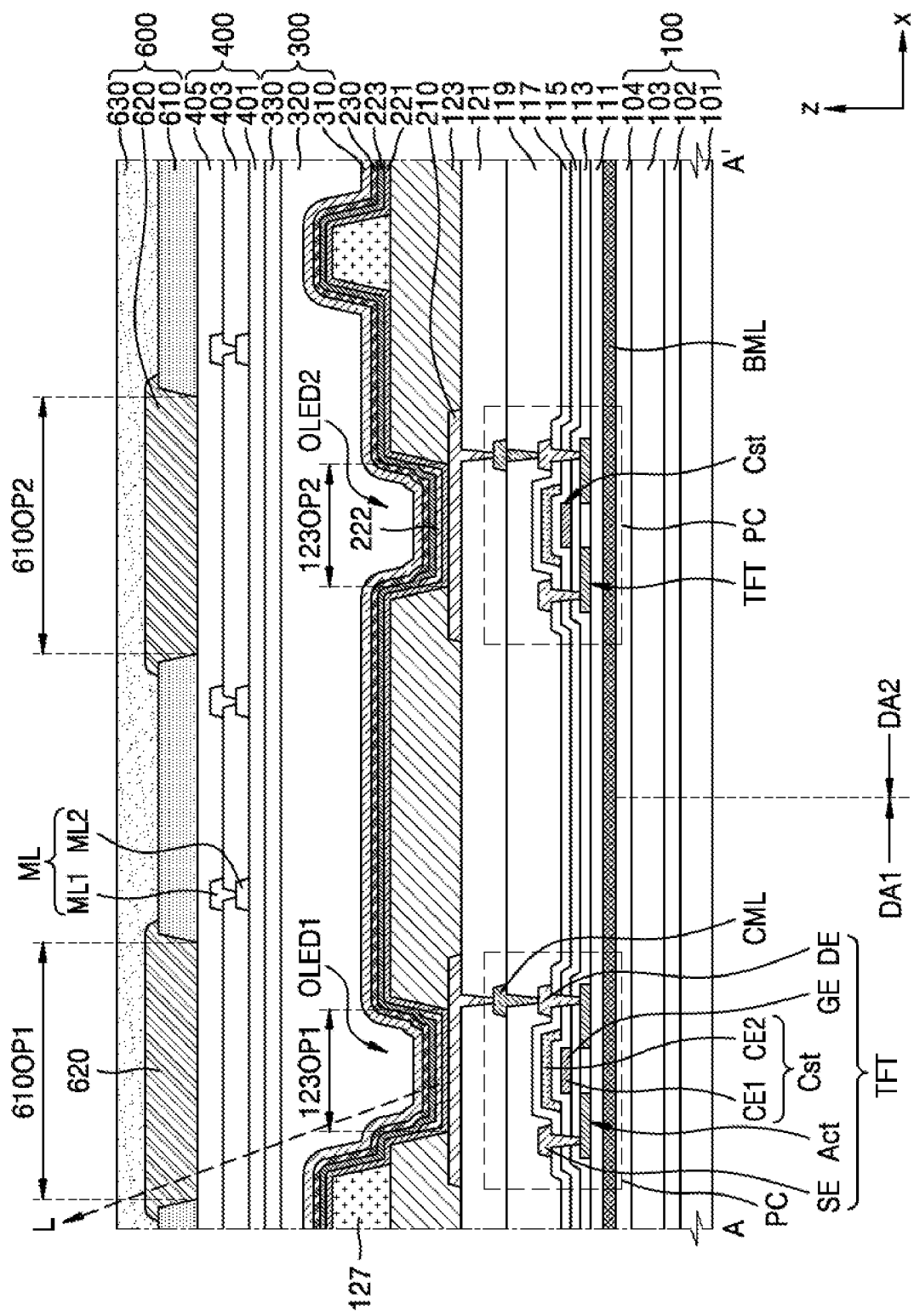
FIG. 15 is a cross-sectional view of a second display region of a display panel and a first display region around the second display region, according to an embodiment.

FIG. 15 is a cross-sectional view of a second display region of a display panel 10 and a first display region DA1 around the second display region DA2, according to an embodiment.

Referring to FIG. 15, the display panel 10 may be similar to the display panel 10 shown in FIG. 10, and reference numerals identical to reference numerals shown in FIG. 10 may indicate the same members. Hereinafter, differences from FIG. 10 are mainly described in detail.

On a plane, the blocking metal layer BML may be arranged between the buffer layer 111 and the substrate 100 in a partial region of the second display region DA2 except for a portion corresponding to the transmission region TA of the first display region DA1 and the second display region DA2. That is, the blocking metal layer BML may be arranged under the first organic light-emitting diode OLED1 and the second organic light-emitting diode OLED2. In this case, a shape in which the blocking metal layer BML is arranged in the second display region DA2 may be a shape illustrated in FIG. 11A or 11B.

A display panel and an electronic device according to embodiments may be capable of realizing a clear image. In a display apparatus and an electronic device according to embodiments, there may not be a gap between layers.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a first display region in which first light-emitting diodes are located;
a second display region at least partially surrounded by the first display region and in which display element groups including second light-emitting diodes and a transmission region are located;
an upper insulating layer defining an emission region of each of the first light-emitting diodes and the second light-emitting diodes and including a tapered portion adjacent to the transmission region;
an electrode on the upper insulating layer and including an opening to correspond to the transmission region; and
a blocking metal layer under the upper insulating layer,
wherein, on a plane, a distance between an edge of the blocking metal layer and a point of the electrode bent at a tapered edge of the upper insulating layer is greater than a set distance defined by Equation 1:

$$Y = H \times \tan \theta$$

where, Y refers to the set distance, H refers to a height from a lower surface of the blocking metal layer to a lower surface of the electrode bent at the tapered edge of the upper insulating layer, and θ refers to one of angles of 45 degrees or less.

2. The display panel of claim 1, wherein the upper insulating layer comprises first openings corresponding to the first light-emitting diodes, second openings corresponding to the second light-emitting diodes, and a third opening between the display element groups.

3. The display panel of claim 2, wherein the opening of the electrode overlaps the third opening.

4. The display panel of claim 2, further comprising thin-film transistors respectively electrically connected to the first light-emitting diodes and the second light-emitting diodes,
wherein each of the thin-film transistors comprises:
a semiconductor layer;
a gate electrode overlapping a portion of the semiconductor layer;
one electrode selected from a source electrode and a drain electrode; and
an insulating layer between at least two selected from the semiconductor layer, the gate electrode, and the one electrode.

5. The display panel of claim 4, wherein the insulating layer comprises an insulating layer opening overlapping the third opening of the upper insulating layer.

6. The display panel of claim 5, further comprising an organic insulating layer on the insulating layer,
wherein a portion of the organic insulating layer is located in the insulating layer opening.

7. The display panel of claim 1, further comprising an anti-reflective layer on the upper insulating layer and including a light-blocking layer and color filters.

8. The display panel of claim 1, wherein the upper insulating layer is opaque.

9. The display panel of claim 1, wherein the transmission region is defined by the upper insulating layer, the blocking metal layer, or the upper insulating layer and the blocking metal layer.

10. An electronic device comprising:
a display panel including a first display region in which first light-emitting diodes are located and a second display region in which second light-emitting diodes and a transmission region are located; and
a component on a lower surface of the display panel and overlapping the second display region,
wherein the display panel comprises:
an upper insulating layer defining an emission region of each of the first light-emitting diodes and the second light-emitting diodes and including a tapered portion adjacent to the transmission region;
an electrode on the upper insulating layer and including an opening to correspond to the transmission region; and
a blocking metal layer under the upper insulating layer, and
wherein, on a plane, a distance between an edge of the blocking metal layer and a point of the electrode bent at a tapered edge of the upper insulating layer is greater than a set distance defined by Equation 1:

$$Y = H \times \tan \theta$$

where, Y refers to the set distance, H refers to a height from a lower surface of the blocking metal layer to a lower surface of the electrode bent at the tapered edge of the upper insulating layer, and θ refers to one of angles of 45 degrees or less.

11. The electronic device of claim 10, wherein the upper insulating layer comprises first openings corresponding to the first light-emitting diodes, second openings corresponding to the second light-emitting diodes, and a third opening between the first light-emitting diodes and the second light-emitting diodes.

12. The electronic device of claim 11, wherein the opening of the electrode overlaps the third opening.

13. The electronic device of claim 11, further comprising thin-film transistors respectively electrically connected to the first light-emitting diodes and the second light-emitting diodes,
wherein each of the thin-film transistors comprises:
a semiconductor layer;
a gate electrode overlapping a portion of the semiconductor layer;
one electrode selected from a source electrode and a drain electrode; and
an insulating layer between at least two selected from the semiconductor layer, the gate electrode, and the one electrode.

14. The electronic device of claim 13, wherein the insulating layer comprises an insulating layer opening overlapping the third opening of the upper insulating layer.

15. The electronic device of claim 14, further comprising an organic insulating layer on the insulating layer,
wherein a portion of the organic insulating layer is located in the insulating layer opening.

16. The electronic device of claim 11, further comprising an anti-reflective layer on the upper insulating layer and including a light-blocking layer and color filters.

17. The electronic device of claim 16, wherein the color filters are structured to correspond to the first light-emitting diodes and the second light-emitting diodes.

18. The electronic device of claim 10, wherein the upper insulating layer is opaque.

19. The electronic device of claim 10, wherein the transmission region is defined by the upper insulating layer, the blocking metal layer, or the upper insulating layer and the blocking metal layer.

20. The electronic device of claim 10, wherein the component comprises at least one of a sensor and a camera.

\* \* \* \* \*